(12) United States Patent
Okuda

(10) Patent No.: US 6,515,500 B1
(45) Date of Patent: Feb. 4, 2003

(54) METHOD AND APPARATUS OF TESTING AND ANALYZING CMOS INTEGRATED CIRCUIT

(75) Inventor: Yukio Okuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 113 days.

(21) Appl. No.: 09/661,793

(22) Filed: Sep. 14, 2000

(30) Foreign Application Priority Data

Sep. 22, 1999 (JP) .......................................... 11-269384

(51) Int. Cl.$^7$ ............................................... G01R 31/26
(52) U.S. Cl. ..................................... 324/765; 324/158.1
(58) Field of Search .............................. 324/765, 158.1, 324/763; 371/1, 327; 714/724, 700, 55, 707, 742, 744, 745; 702/109

(56) References Cited

U.S. PATENT DOCUMENTS 5,894,226 A * 4/1999 Koyama ..................... 324/765
6,124,724 A * 9/2000 Statovici et al. ............. 324/765

* cited by examiner

*Primary Examiner*—Michael Sherry
*Assistant Examiner*—Jimmy Nguyen
(74) *Attorney, Agent, or Firm*—Rader, Fishman & Grauer PLLC; Ronald P. Kananen

(57) ABSTRACT

A method of testing a CMOS integrated circuit including the steps of applying a test signal to a CMOS integrated circuit under test and measuring a quiescent power supply current at a plurality of strobe points, calculating defect current estimates corresponding to the strobe points based on average value ratios of the quiescent power supply currents at the plurality of strobe points calculated in advance for a good CMOS integrated circuit, measured values of the quiescent power supply current at the plurality of strobe points, and an average value of the measured values of the quiescent power supply currents, and judging the CMOS integrated circuit under test as a defect when an absolute value of a calculated defect current estimate is larger than an absolute value of an allowable error of a measured value of the quiescent power supply current, whereby it is possible to detect the defect current of a CMOS integrated circuit with a large quiescent power supply current and a large variation.

29 Claims, 18 Drawing Sheets

FIG.2

| CASE | FEEDING POWER ROUTE | CAUSE | CONDUCT CONDITION | APPROXIMATE FORMULA |
|---|---|---|---|---|
| $L_1$ | WELL – BASE | PN–J INVERSE BIAS | ON,OFF | $\propto (e^{V_D/V_{th}} - 1)$ |
| $L_2$ | DRAIN – WELL | PN–J INVERSE BIAS | OFF | $\propto (e^{V_D/V_{th}} - 1)$ |
| $L_3$ | DRAIN – SOURCE | WEAK – INVERSE | OFF | $\propto \dfrac{W_{xc}}{L_{eff}} e^{-k_1 V_{th}/T} (1 - e^{-k_2 V_D})$ |

$V_D$ : POWER SUPPLY VOLTAGE
$L_{eff}$ : EFFECT GATE LENGTH
$V_{th}$ : THRESHOLD
$W_{xc}$ : CHANNEL EFFECT AREA
$T$ : OPERATIONAL TEMPERATURE
$k_1, k_2$ : CONSTANT1, 2

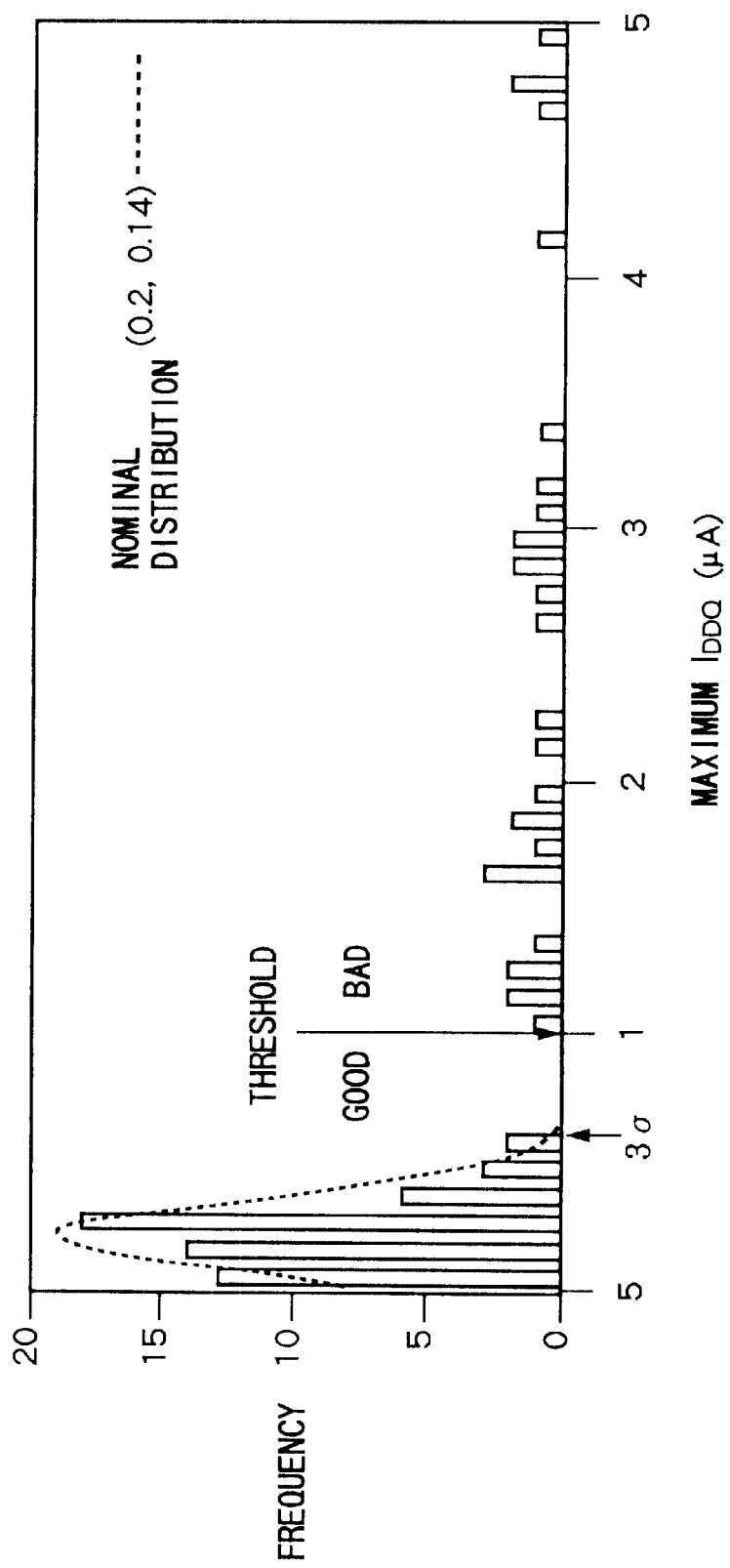

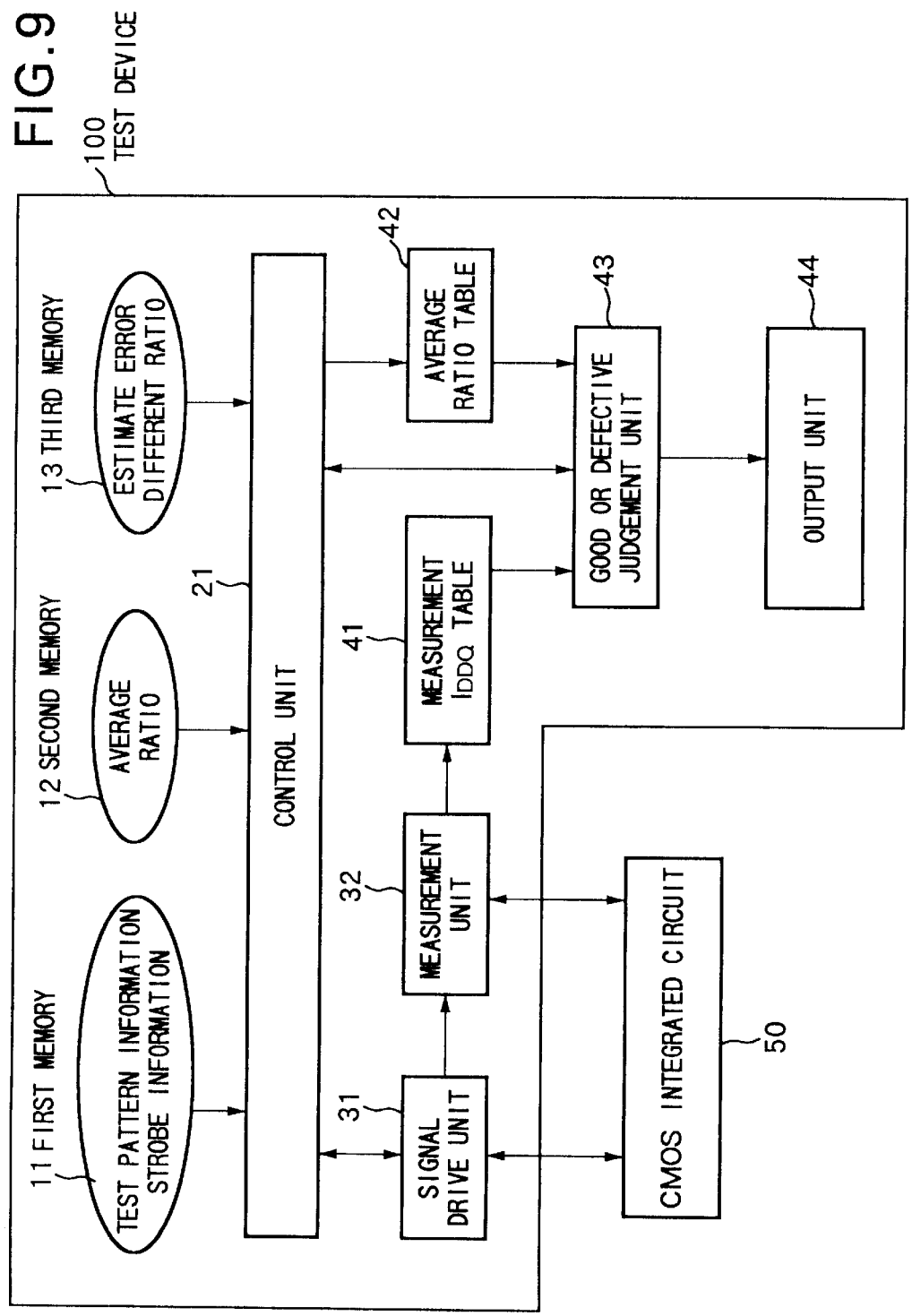

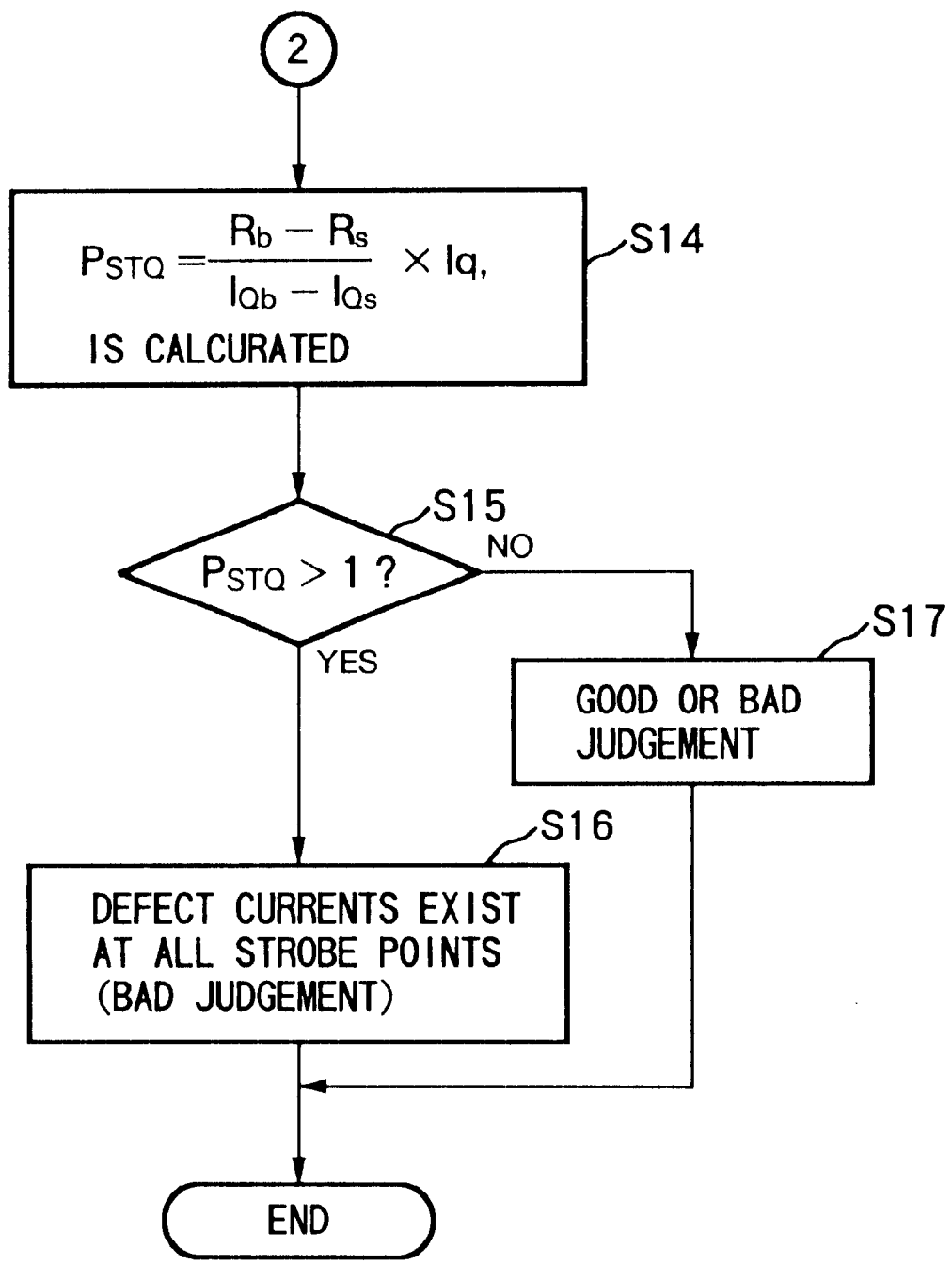

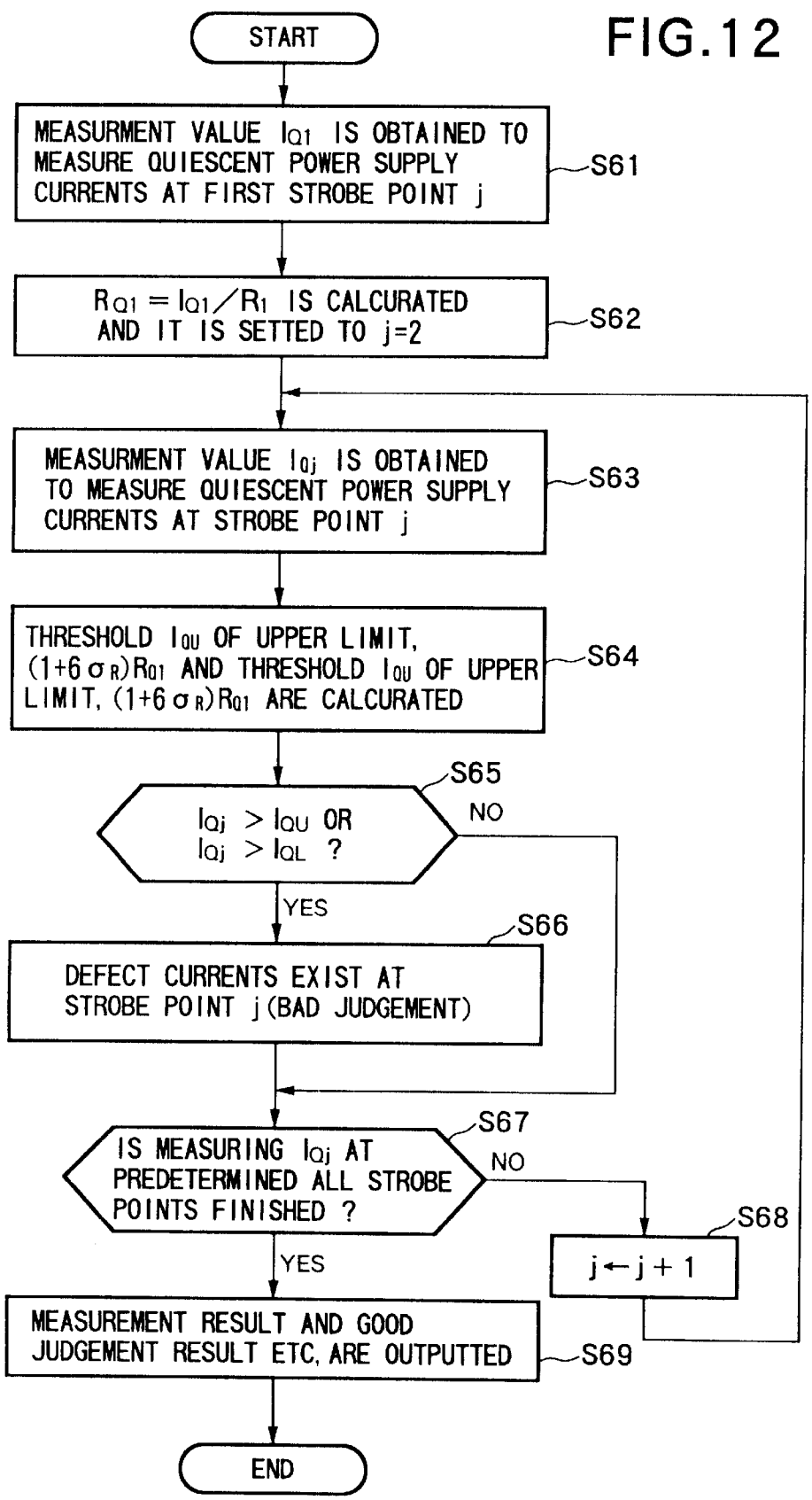

METHOD AND APPARATUS OF TESTING AND ANALYZING CMOS INTEGRATED CIRCUIT

BACKGROUND OF THE INVENTION

1. Field of the Invention

The present invention relates to a method and apparatus of testing and analyzing a complementary metal oxide semiconductor (CMOS) integrated circuit.

2. Description of the Related Art

Japanese Unexamined Patent Publication (Kokai) No. 8-271584, Japanese Unexamined Patent Publication (Kokai) No. 9-211088, U.S. Pat. No. 5,392,293, U.S. Pat. No. 5,519,333, and U.S. Pat. No. 5,889,408 disclose testing ($I_{DDQ}$ testing) using a drain-to-drain quiescent power supply current ($I_{DDQ}$) of a CMOS integrated circuit.

In $I_{DDQ}$ testing, measures the quiescent power supply current of a CMOS integrated circuit, is measured, and a good or defective of the CMOS integrated circuit is determined by using the measured current. Note that a CMOS integrated circuit under test is also called a device under test (DUT).

A quiescent power supply current $I_{DDQ}$ includes a leakage current (intrinsic leakage current) flowing even in a good device and a defect current caused by a defect. That is, a quiescent power supply current $I_{DDQ}$, (hereinafter also called a quiescent power supply current $I_Q$) can be expressed by the summation of the intrinsic leakage power supply current $I_F$ and defect current $I_D$ and can be shown by the following formula (1):

$$I_Q = I_F + I_D \quad (1)$$

The intrinsic leakage current $I_F$ can be expressed by the summation of the leakage current (FET leakage current) $I_T$ generated due to the structure of a metal oxide semiconductor field effect transistor (MOSFET) and the leakage current (circuit leakage current) caused due to a circuit operation.

The circuit leakage current is generated by an analog circuit, pull-up current, bus collision, etc. Generation of the circuit leakage current is however avoided when $I_{DDQ}$ testing for measuring the quiescent power supply current $I_Q$ and therefore it can be disregarded. Therefore, the following formula (2) can represent the defect current $I_D$:

$$I_D = I_Q - I_T \quad (2)$$

In the $I_{DDQ}$ testing, the FET leakage current $I_T$ of the CMOS integrated circuit under test is unknown and therefore estimated by some method or another. The good or defect of the CMOS integrated circuit is judged by using the measured quiescent power supply current $I_Q$.

The main defect current $I_D$ in the quiescent power supply current $I_Q$ is current generated by internal shorts among gates, sources, drains, and well of the FET and a bridging between interconnection patterns. The value of the defect current $I_D$ depends on the power supply voltage and equivalent resistance value.

FIG. 1 is a graph of the relative frequency distribution of the maximum $I_{DDQ}$ (the maximum value of the quiescent power supply current $I_Q$) in two types of integrated circuits as an example. The maximum $I_{DDQ}$ of an abscissa is broken down into 0 to 100 $\mu$A, 100 to 200 $\mu$A, ..., 700 to 800 $\mu$A, and 800 $\mu$A or more.

The effective gate length Leff of the type A and B CMOS integrated circuits is 0.5 $\mu$m. A maximum $I_{DDQ}$ of more than 30 $\mu$A is shown. The distribution shown in FIG. 1 substantially corresponds to the distribution of the defect current $I_D$.

Further, A. E. Gattiker and W. Maly, "Toward Understanding 'Iddq-Only' Fails", in *Int. Test Conf.*, pp.174–183, IEEE, 1998, states that there is an indirectly generated defect current, in addition to the defect current generated directly by the bridging. This indirect defect current is generated because when a potential of a signal line falls between the power-supply voltage and the ground potential for some reason or another, the p type MOSFET and n type MOSFET driven by this signal line become on in state at the same time, and a penetration current flows.

It is necessary to apply a different voltage to the two ends of a bridge forming a defect in order to cause generation of the defect current $I_D$.

Since it is impossible to set the potential required for all presumed failures all at once, a test signal of a test pattern prepared by an automatic test pattern generator (ATPG) or a test signal of a test pattern for a function test is applied and the quiescent power supply current $I_Q$ measured when a terminal becomes the necessary potential. Note that a measurement point for measuring the quiescent power supply current $I_Q$ is called as a strobe (strobe point).

The strobe point (defect detection strobe point) which can detect a defect differs according to the cause of the defect.

Since bridging between the power supply line for supplying a power supply voltage $V_D$ and a ground line has no relation with the potential of the signal line, the defect is detected at all strobe points and the defect current becomes the same.

Note that there are few defect detection strobe points which can detect bridging of interconnections between cells. Further, the number of defect detection strobe points which can detect a short of the MOSFET in the cell is a levels between the two.

According to A. Keshavarzi, K. Roy, and C. F. Hawkins, "Intrinsic Leakage in Low Power Deep Submicron CMOS ICs", in *Int. Test Conf.*, pp. 146–155, IEEE, 1997; A. Ferre and J. Figueras, "On Estimating Bounds of the Quiescent Power Supply Current for $I_{DDQ}$ Testing", in *VLSI Test Sym.*, pp. 106–111, IEEE, 1996; and P. C. Maxwell and J. R. Rearick, "Estimation of Defect-Free IDDQ in Submicron Circuits Using Switch Level Simulation", in *Int. Test Conf.*, pp. 882–889, IEEE, 1998, the leakage current (EFT leakage current) $I_T$ of a defect-free normal MOSFET can be classified based on the ON/OFF state of the MOSFET, the current path, etc.

FIG. 2 is a graph showing a classification of the leakage current of a MOSFET.

FIG. 2 shows a feeding power route, causes of occurrence, conduction conditions, and an approximation formula of the leakage current with respect to cases $L_1$, to $L_3$.

In the case $L_1$, the feeding power route is between a well and base (substrate), the cause of occurrence is an inverse bias of a pn junction, and the conduction condition is an ON state.

In the case $L_2$, the feeding power route is between a drain and well, the cause of occurrence is the inverse bias of the pn junction, and the conduction condition is an OFF state.

In the case $L_3$, the feeding route is between the drain and source, the cause of occurrence is a weak inverse, and the conduction condition is an OFF state.

The leakage current of the case $L_1$ is always generated if the well and base are inverse biases and is constant regardless of the strobe (strobe point).

The leakage current of the case $L_2$ is generated in a case where the MOSFET is in an OFF state and the drain thereof is connected to the power supply line and/or the ground line.

The leakage currents of the case $L_3$ is generated in a case where the MOSFET is in an off state and the drain and the source thereof are connected to the power supply line and/or the ground line.

If the leakage currents of the cases Li (i =1 to 3) in each MOSFET in a CMOS integrated circuit are averaged for each case, the leakage currents $L_{N1}$ and $L_{N1}$ in per n type MOSFET and p type MOSFET are found.

The FET leakage current IT can be expressed by the following formula (3) using the numbers $N_{N1}$ and $N_{P1}$ of the n type MOSFETs and the p type MOSFETs in which the leakage current of the case $L_1$ has been generated:

$$I_T = \sum_{F=1}^{3} (N_{Ni} \times I_{Mi} + N_{Pi} \times I_{Pi}) \quad (3)$$

FIG. 3 is a chart illustrating the distribution of the maximum $I_{DDQ}$ in an CMOS integrated circuit and shows the frequency distribution for every 0.1 $\mu$A. The effective gate length Leff of the CMOS integrated circuit is 0.5 $\mu$m.

In FIG. 3, a CMOS integrated circuit having a maximum $I_{DDQ}$ of less than 1 $\mu$A is judged as good and a CMOS integrated circuit having a maximum $I_{DDQ}$ of 1 $\mu$A or more is judged as defective.

Note that the broken line shows a curve of an average value of 0.2 $\mu$A and a standard deviation $\sigma$ of 0.14 $\mu$A. In a good CMOS integrated circuit having a maximum $I_{DDQ}$ of below 1 $\mu$A, the distribution of the FET leakage current is the normal distribution or similar to the normal distribution.

Note that if 1($\approx$0.2÷6×0.14) $\mu$A of exactly 6$\sigma$ from the average value is made the maximum FET leakage current assuming a variation in current between lots, a quiescent power supply current $I_Q$ above that is considered to be due to a defect. That is, 1 $\mu$A is the threshold value of judgement of good or defective.

When the threshold value of judgement of good or defective is set to 1 $\mu$A in this way, a defect current of up to a maximum of 0.9 (=1 to 0.1) $\mu$A in a CMOS integrated circuit having an FET leakage current of 0.1 $\mu$A in the chart of FIG. 3 is missed.

Note that in the chart of FIG. 3, defective CMOS integrated circuits having a maximum $I_{DDQ}$ of 1 to 4 $\mu$A are substantially uniformly distributed. It is assumed that they are distributed at a range below 1 $\mu$A as well. However, the number of defective CMOS integrated circuits of less than 1 $\mu$A is small, so the failure to catch such defective CMOS integrated circuits in the testing can be disregarded.

FIG. 4 is a graph of the distribution of the FET leakage current in two good CMOS integrated circuits. Note that in a good CMOS integrated circuit, the defect currents $I_D$ is considered of a degree which can be disregarded and so the quiescent power supply current $I_{DDQ}$ of a good CMOS integrated circuit is considered the FET leakage current. The effective gate length Leff of the two CMOS integrated circuits LSI-1 and LSI-2 is 0.25 $\mu$m.

The abscissa of FIG. 4 shows the consecutive numbering of the strobe points (strobe number), while the ordinate shows the magnitude of the FET leakage current at each strobe point.

The FET leakage current of the CMOS integrated circuit LSI-1 changes up to ±10 $\mu$A about approximately 73 $\mu$A, while the FET leakage current of the CMOS integrated circuit LSI-2 changes up to ±5 $\mu$A about approximately 29 $\mu$A.

FIG. 5 is a chart of the relative frequency distribution of an FET leakage current at all 800 strobe points in the CMOS integrated circuit LSI-1 and LSI-2 of FIG. 4. The abscissa is graduated into units of 10 $\mu$A.

In the chart of FIG. 5, two different variations are seen.

The first variation is the variation among strobe problems in the same CMOS integrated circuit as seen from 25 to 35 $\mu$A.

The second variation is the variation between CMOS integrated circuits such as the center of frequency distribution being around 73 $\mu$A in the CMOS integrated circuit LSI-1 and around 29 $\mu$A in the CMOS integrated circuit LSI-2.

FIG. 6 is a chart illustrating the relative frequency distribution of FET leakage current in a case where the average value of the quiescent power supply current in a CMOS integrated circuit (average $I_{DDQ}$) is considered the FET leakage current. The chart of FIG. 6 illustrates the distribution of 32 good CMOS integrated circuits randomly sampled from two lots. The current is widely distributed from 0 to 350 $\mu$A.

The above judgement of good or defective using as the threshold the estimated maximum value of the FET leakage current is liable to miss catching many defects.

As one example, if 85$\mu$A is made the threshold value in the chart of FIG. 5, the occurrence of a defect current of 60 (=85 to 25) $\mu$A in a CMOS integrated circuit LSI-1 having an FET leakage current of 25 $\mu$A cannot be detected.

In this way, in the above $I_{DDQ}$ testing measuring the quiescent power supply current of a CMOS integrated circuit and judging that circuit to be defective when the measured value is above a threshold, as described in T. W. Williams, R. H. Dennard, and R. Kapur, "Iddq Test: Sensitivity Analysis of Scalings", in *Int. Test Conf.*, pp. 786–792. IEEE, 1996, sometimes accurate judgement is difficult.

For example, this is because, when the interconnection pattern of the CMOS integrated circuit is fine, the leakage current of a MOSFET (FET leakage current) increases exponentially along with the fineness. Specifically, this is because the FET leakage current in the case $L_3$ increases exponentially due to the shortening of the effective gate length Leff and the fall in the threshold voltage $V_{th}$.

Therefore, various methods for reducing FET leakage current during $I_{DDQ}$ testing have been proposed.

One method of reducing the FET leakage current in $I_{DDQ}$ testing is to lower the FET leakage current when strobing so as to reduce the threshold. The low power supply voltage method, low temperature measurement method, and a well bias method are known for this.

Low Power Supply Voltage Method

The low power supply voltage method uses the fact that the leakage current falls by the approximation formulas of cases $L_1$ to $L_3$ shown in FIG. 2 when lowering the power supply voltage $V_D$. However, since the power supply voltage can only be reduced to an extent where the circuit does not malfunction, the rate of reduction of the FET leakage current is low.

Further, several milliseconds (ms) are necessary to change the power supply voltage $V_D$ before and after strobing. The test cost is increased along with this increase of testing time.

Moreover, according to A. E. Gattiker and W. Maly, "Toward Understanding 'Iddq-Only' Fails", in *Int. Test Conf.*, pp. 174–183, IEEE, 1998, there are cases where the fault penetration current disappears when lowering the power supply voltage $V_D$ and this may lead to defects being missed in the testing.

Low Temperature Measurement Method

This method uses the fact that the FET leakage current falls by the approximation formula of the case $L_3$ shown in FIG. 2 when lowering the operating temperature.

The lower limit temperature is determined by the guaranteed reliability and the cost of the test system for maintaining the low temperature and test system. The limit in civilian use low temperature maintaining systems is about 0 oC, so the rate of reduction of the FET leakage current is low. Further, the expense of the system and its running costs pile up and increase costs.

Well Bias Method

The well bias method is described in a paper of A. Keshavarzi, K. Roy, and C. F. Hawkins, "Intrinsic Leakage in Low Power Deep Submicron CMOS ICs", in *Int. Test Conf.*, pp. 146–155, IEEE, 1997.

The leakage current falls by the approximation formulas of the cases $L_1$ to $L_3$ shown in FIG. 2 when the threshold voltage $V_{th}$ is raised. Further, the threshold voltage rises when a bias voltage is applied between the source and well.

In this method, since interconnections are added to apply the bias voltage, the chip of the CMOS integrated circuit on the chip is increased and the cost rises.

Further, the rate of reduction of the leakage current is very susceptible to variations in the effective gate length Leff, so the FET leakage current fluctuates along with increasing miniaturization.

On the other hand, methods have been proposed for judging good or defective or detecting defect current in a state with a large FET leakage current. For example, there are the signature analysis method, delta method, and upper and lower limit method.

However, in these methods, it suffers from that detection of defect currents less than the variation of the FET leakage current among strobes is impossible, defects where the same defect current is generated at all the strobe points miss being caught, and estimation of the defect current is difficult.

Signature Analysis Method

The signature analysis method is disclosed in a paper of A. E. Gattiker and W. Mary, "Current Signatures", in *VLSI Test Sym.*, pp. 112–117. IEEE, 1996.

In this method, since the measured quiescent power supply currents are rearranged in order of magnitude and good or defective is judged based on existence of any sharp steps, it is not too well suited for mass production.

Delta Method

The delta method is described in a paper of C. Thibeault, "On the Comparison of $\Delta I_{DDQ}$ and $I_{DDQ}$ Testing", in *VLSI Test Sym.*, pp. 143–150, IEEE, 1999.

In this method, defective CMOS integrated circuits are separated by the amount of change of the quiescent power supply current, so a large amount of statistical processing is necessary. Therefore, this method is not too well suited to a mass production process.

Upper and Lower Limit Method

The upper and lower limit method is disclosed in U.S. Pat. No. 5,914,615, Jun. 1999, B. Chess, "Method of Improving the Good or Defective and Efficiency of Iddq Testing".

In this method, the upper and lower limit are set according to the average value of the measured quiescent power supply currents and are used to detect defective CMOS integrated circuits.

However, since variations among CMOS integrated circuits and variations among strobes are not differentiated, error sometimes occurs in the upper limit value and lower limit value calculated from the average value of the quiescent power supply currents.

SUMMARY OF THE INVENTION

A first object of the present invention is to provide a method and apparatus of testing a CMOS integrated circuit capable of judging the good or defective of a CMOS integrated circuit having a large quiescent power supply current and large variations.

A second object of the present invention is to provide a method and apparatus of analyzing a CMOS integrated circuit capable of detecting a defect current of a CMOS integrated circuit having a large quiescent power supply current and large variations.

According to a first aspect of the present invention, there is provided a method of testing a CMOS integrated circuit comprising the steps of: applying a test signal to a CMOS integrated circuit under test and measuring a quiescent power supply current at part or all of the strobe points among a predetermined plurality of strobe points; and judging the good or defective of the CMOS integrated circuit under test based on average value ratios of quiescent power supply currents of the plurality of strobe points calculated in advance for a good CMOS integrated circuit, the measured values at the part or all of the strobe points, and the average value of the measured values.

Preferably the step of judging the good or defective based on the average value ratios, the measured values, and the average value comprises the steps of calculating defect current estimated value $P_{Dj}$: $I_{Qj} - R_j \times Iq$ corresponding to the strobe points based on the average value ratios $R_j$ of the quiescent power supply currents at the plurality of strobe points, the measured values $I_{Qj}$ at the part or all of the strobe points, and the average value Iq; and judging the good or defective of the CMOS integrated circuit under test based on the calculated defect current estimates $P_{Dj}$ and allowable error E of the measured values of the quiescent power supply current.

Alternatively, the step of judging good or defective based on the defect current estimated value $P_{Dj}$ and the allowable error E judges the CMOS integrated circuit under test as a defect when an absolute value of a calculated defect current estimate $P_{DJ}$ is larger than an absolute value of the allowable error E.

Alternatively, the step of judging good or defective based on the defect current estimates $P_{Dj}$ and the allowable error E comprises the steps of calculating a variation rate $P_{STQ} = Iq \times (R_b - R_s)/(I_{Qb} - I_{Qs})$ when each of a plurality of absolute values of the plurality of defect current estimated value $P_{DJ}$ corresponding to all of the strobe points is not more than the absolute value of the allowable error E and of judging the CMOS integrated circuit under test as a defect when the variation rate $P_{STQ}$ is greater than 1. Here, $R_b$ is the biggest average value ratio among the average value ratios $R_j$, $I_{Qb}$ is the measured value of the strobe point corresponding to the biggest average value ratio $R_b$, $R_s$ is the smallest average value ratio among the average value ratios $R_j$, and $I_{Qs}$ is the measured value of the strobe point corresponding to the smallest average value ratio $R_s$.

In the latter case, the step of judging good or defective based on the defect current estimated value $P_{Dj}$ and the allowable error E may further comprise a step of judging the CMOS integrated circuit under test as good when the variation rate $P_{STQ}$ is less than 1.

Preferably, the allowable error E of the measured quiescent power supply current is whichever of a product ($E_R \times Iq$) of a maximum error rate $E_R$ among error rates $E_{Rj}$ of average value ratios $R_j$ at the plurality of strobe points and the average value Iq and of a maximum measurement error $E_M$ has a larger absolute value.

Preferably, the average value is defined as an arithmetic average value of the measured values at part or all of the strobe points.

Alternatively, the average value is defined as ratio ($I_{Q1}/R_1$) between a measured quiescent power supply current $I_{Q1}$ at a predetermined strobe point of the part or all of the strobe points and the average value ratio $R_1$ of the quiescent power supply current at the predetermined strobe point.

In this case, preferably the step of judging good or defective based on the average value ratios, the measured values, and the average value comprises the steps of calculating defect current predictions $P_{Q1j} = I_{Qj} - R_j \times (I_{Q1}/R_1)$ corresponding to the strobe points based on the average value ratios $R_j$ of the quiescent power supply currents at the plurality of strobe points, the measured values $I_{Qj}$ at the part or all of the strobe points, and the ratio($I_{Q1}/R_1$) and judging good or defective based on the calculated defect current predictions $P_{Q1j}$ and the allowable error E of the measured values of the quiescent power supply current.

More preferably, the step of judging good or defective based on the defect current predictions $P_{Q1j}$ and the allowable error E comprises a step of judging the CMOS integrated circuit under test as a defect when an absolute value of a calculated defect current prediction $P_{Q1j}$ is larger than an absolute value of the allowable error E.

In the above case, preferably, the allowable error E of the measured quiescent power supply current is whichever of a product ($E_R \times I_{Q1}/R_1$) of a maximum error ratio $E_R$ among a plurality of error ratios $E_{Rj}$ of the average value ratios $R_j$ of the quiescent power supply current at the plurality of strobe points and the ratio ($I_{Q1}/R_1$) and of the maximum measurement error $E_M$ has the larger absolute value.

In the above case, alternatively, the step of judging good or defective based on the average value ratios, the measured values, and the average value comprises the steps of calculating an upper limit threshold $I_{QU} = (1+f \times \sigma_R) \times I_{Q1}/R_1$ based on the average value ratio $R_1$ of the quiescent power supply current at the predetermined strobe point, the ratio ($I_{Q1}/R_1$), and a constant $\underline{f}$ of 4 to 7; and judging the CMOS integrated circuit under test as a defect when a measured quiescent power supply current is larger than the upper limit threshold $I_{QU}$, where $\sigma_R$ is the square root of the average value of $(R_j-1)^2$ at the plurality of strobe points.

Here, preferably the step of judging good or defective based on the average value ratios, the measured values, and the average value further comprises the steps of calculating a lower limit threshold $I_{QL} = (1-f \times \sigma_R) \times I_{Q1}/R_1$; judging the CMOS integrated circuit under test as a defect when a measured value is below the lower limit threshold $I_{QL}$; and judging the CMOS integrated circuit under test as good when each of the measured values at the part or all of the strobe points between the lower limit threshold $I_{QL}$ and the upper limit threshold $I_{QU}$.

Here, alternatively, the value of the constant f is 5 to 6.

In the above case, alternatively, the step of judging good or defective based on the average value ratios, the measured values, and the average value comprises the steps of calculating a lower limit threshold $I_{QL} = (1-f \times \sigma_R) \times I_{Q1}/R_1$ based on the average value ratio $R_1$ of the quiescent power supply current at the predetermined strobe point, the ratio ($I_{Q1}/R_1$), and a constant f of 4 to 7 and judging the CMOS integrated circuit under test as a defect when the measured quiescent power supply current is smaller than the lower limit threshold $I_{QL}$, where $\sigma_R$ is the square root of the average value of $(R_j-1)^2$ at the plurality of strobe points. Here, preferably, the value of the constant f is 5 to 6.

In the above case, alternatively, the predetermined strobe point comprises a first strobe point of the part or all of the strobe points.

According to the present invention, there is also provided an apparatus for testing a CMOS integrated circuit comprising: a means for applying a test signal to a CMOS integrated circuit under test and measuring a quiescent power supply current at part or all of the strobe points among a predetermined plurality of strobe points; and a means for judging the good or defective of the CMOS integrated circuit under test based on average value ratios of quiescent power supply currents of said plurality of strobe points calculated in advance for a good CMOS integrated circuit, the measured values at the part or all of the strobe points, and the average value of the measured values.

According to a second aspect of the present invention, there is provided a method of analyzing a CMOS integrated circuit, comprising the steps of applying a test signal to a CMOS integrated circuit under test and measuring a quiescent power supply current at a predetermined plurality of strobe points; calculating defect current estimated values $P_{Dj} = I_{Qj} - R_j \times Iq$ corresponding to the strobe points based on average value ratios $R_j$ of quiescent power supply currents at the plurality of strobe points calculated in advance for a good CMOS integrated circuit, measured values $I_{Qj}$ at the plurality of strobe points, and an average value Iq of the measured values; calculating a summation $P_{DSUM}$ of negative value defect current estimated value $P_{DJ}$ among the calculated defect current estimated values $P_{DJ}$; calculating a summation $R_{SUM}$ of the average value ratios $R_j$ for the strobe points corresponding to the negative value defect current estimated value $P_{Dj}$ among the plurality of strobe points; and calculating an absolute value $|P_{DSUM}/P_{SUM}|$ of a ratio of the summation $P_{DSUM}$ of the defect current estimated value $P_{Dj}$ and the summation $R_{SUM}$ of the average value ratios $R_j$.

Preferably, the method further comprises the steps of calculating first current values $I_{Dj} = P_{Dj+Rj} + R_j \times |P_{DSUM}/R_{SUM}|$ for strobe points corresponding to a positive value defect current estimated value $P_{Dj}$ among the plurality of strobe points and detecting first current values which are larger than an absolute value of an allowable error E of a measured value of the quiescent power supply current among the calculated first current values $I_{Dj}$ as defect current values.

Alternatively, the method further comprises the steps of calculating a second current value $I_D = (1-1/P_{STQ}) \times Iq$ based on a variation rate $P_{STQ} = Iq \times (R_b - R_s)/(I_{Qb} - I_{Qs})$ when each of the calculated first current values $I_{Dj}$ is not more than the absolute value of the allowable error E and detecting that each of the measured values at the plurality of strobe points includes a defect current value indicated by the second current value $I_D$ when the second current value $I_D$ is larger than the absolute value of the allowable error E, where $R_b$ is the biggest average value ratio among the average value ratios $R_j$, $I_{Qb}$ is the measured value at the strobe point corresponding to the biggest average value ratio $R_b$, $R_s$ is the smallest average value ratio among the average value ratios $R_j$, and $I_{Qs}$ is the measured value at the strobe point corresponding to the smallest average value ratio $R_s$.

Here, preferably, the method further comprises the step of detecting that each of the measured values at the plurality of strobe points does not include a defect current value when the second current value $I_D$ is not more than the absolute value of the allowable error E.

Preferably the allowable error E of the measured quiescent power supply current is whichever of a product ($E_R \times Iq$) of a maximum error rate $E_R$ among error rates $E_{RJ}$ of average value ratios $R_j$ of the quiescent power supply current at the plurality of strobe points and the average value Iq and of a maximum measurement error $E_M$ has a larger absolute value.

Preferably, the average value is defined as an arithmetic average value of the measured values at the plurality of strobe points.

Preferably, the average value ratios of the quiescent power supply currents at the plurality of strobe points are ratios between the plurality of measured values obtained by applying the test signal to a good CMOS integrated circuit and measuring the quiescent power supply current at a plurality of strobe points and the average value of the plurality of measured values which are then in turn averaged for a plurality of good CMOS integrated circuits or for more than a plurality of good CMOS integrated circuits.

According to the present invention, there is provided an apparatus for analyzing a CMOS integrated circuit, comprising: a means for applying a test signal to a CMOS integrated circuit under test and measuring a quiescent power supply current at a predetermined plurality of strobe points; a means for calculating defect current estimated values $P_{Dj}=I_{Qj}-R_j \times Iq$ corresponding to the strobe points based on average value ratios $R_j$ of quiescent power supply currents at the plurality of strobe points calculated in advance for a good CMOS integrated circuit, measured values $I_{Qj}$ at the plurality of strobe points, and an average value Iq of the measured values; a means for calculating a summation $P_{DSUM}$ of negative value defect current estimated value $P_{Dj}$ among the calculated defect current estimated values $P_{Dj}$; a means for calculating a summation $R_{SUM}$ of the average value ratios $R_j$ for the strobe points corresponding to the negative value defect current estimated values $P_{Dj}$ among the plurality of strobe points; and a means for calculating an absolute value $|P_{DSUM}/P_{SUM}|$ of a ratio of the summation $P_{DSUM}$ of the defect current estimated value $P_{Dj}$ and the summation $R_{SUM}$ of the average value ratios $R_j$.

In both the method and apparatus of testing and the method and apparatus of analyzing a CMOS integrated circuit according to the present invention, preferably, the test signal has a plurality of test patterns and the method further comprises a step of switching test patterns between adjacent strobe points of the plurality of strobe points.

That is, in the method and apparatus of testing a CMOS integrated circuit according to the present invention, since use is made of average value ratios of quiescent power supply currents at a plurality of strobe points calculated in advance for a good CMOS integrated circuit and an average value of measured values of the quiescent power supply currents, it is possible to determine the distribution of quiescent power supply currents in a good CMOS integrated circuit with reference to the average value of the quiescent power supply currents and therefore learn the ranges which measured values can take when the CMOS integrated circuit under test is a good one from the average value ratios of the quiescent power supply currents and the average value of the measured values.

For example, the method and apparatus calculates defect current estimates $P_{Dj}=I_{Qj}-R_j \times Iq$ based on the average value ratios $R_j$ of quiescent power supply currents at the plurality of strobe points, the measured values $I_{Qj}$, and the average value Iq of the measured values.

By multiplying the average value Iq of the measured values by an average value ratio $R_j$, it is possible to calculate the expected value of a quiescent power supply current $I_{DDQ}$ in a case where the CMOS integrated circuit under test is a good one. By subtracting this expected value ($R_j \times Iq$) from a measured value $I_{Qj}$, it is possible to obtain a defect current estimate.

Note that a defect current estimate $P_{Dj}$ can be predicted from a defect current $I_{Dj}$ at that strobe point, the summation of the defect currents at all strobe points, the total number m of the strobe points, and the average value ratio $R_j$, so a value not depending on the size of a measured value of the quiescent power supply current can be obtained.

Further, the method and apparatus for example calculates defect current predictions $P_{Q1j}=I_{Qj}-R_j \times I_{Q1}/R_1$ based on the average value ratios $R_j$ of the quiescent power supply currents at a plurality of strobe points, the measured values $I_{Qj}$, and the ratio ($I_{Q1}/R_1$).

By multiplying the ratio ($I_{Q1}/R_1$) corresponding to the prediction of the average value of the measured values and an average value ratio $R_j$, it is possible to calculate an expected value of the quiescent power supply current $I_{DDQ}$ in a case where the CMOS integrated circuit under test is a good device. By subtracting this expected value ($I_{Q1} \times R_j/R_1$) from a measured value $I_{Qj}$, it is possible to obtain a defect current prediction.

Note that the defect current prediction $P_{Q1j}$ can be projected from the defect currents $I_{Dj}$ and $I_{D1}$ at strobe points and the average value ratios $R_j$ and $R_1$, so a value not depending on the size of the measured value of the quiescent power supply current can therefore be obtained.

The method for example calculates an upper limit threshold $I_{QU}=(1+f \times \sigma_R) \times I_{Q1}/R_1$ based on the average value ratio $R_1$ of the quiescent power supply current at the predetermined strobe point, the ratio ($I_{Q1}/R_1$), and a constant f of 4 to 7.

By multiplying the ratio ($I_{Q1}/R_1$) corresponding to the prediction of average value of the measured values by ($f \times \sigma_R$) relating to the standard deviation of the average value ratios $R_1$, it is possible to calculate the range of distribution of the quiescent power supply current $I_{DDQ}$ in the case where the CMOS integrated circuit under test is good. By adding this range ($f \times \sigma_R \times I_{Q1}/R_1$) and the ratio ($I_{Q1}/R_1$), it is possible to obtain the upper limit threshold.

$\sigma_R$ can be calculated from an average value ratio $R_1$ and the total number m of the strobe points, so a value not depending on the measured value of the quiescent power supply current can be obtained.

The method for example calculates the lower limit threshold $I_{QL}=(1-f \times \sigma_R) \times I_{Q1}/R_1$ based on the average value ratio $R_1$ of the quiescent power supply current at the predetermined strobe point, the ratio ($I_{Q1}/R_1$), and a constant f of 4 to 7.

By multiplying the ratio ($I_{Q1}/R_1$) corresponding to the prediction of the average value of the measured values by ($f \times \sigma_R$) relating to the standard deviation of the average value ratios $R_1$, it is possible to calculate the range of distribution of the quiescent power supply current $I_{DDQ}$ the case where the CMOS integrated circuit under test is good. By subtracting this range ($f \times \sigma_R \times I_{Q1}/R_1$) from the ratio ($I_{Q1}/R_1$), it is possible to obtain the lower limit threshold.

$\sigma_R$ can be calculated from the average value ratio $R_1$ and the total number m of the strobe points, so a value not depending on the measured value of the quiescent power supply current can be obtained.

The method of analyzing a CMOS integrated circuit according to the present invention calculates defect current estimates $P_{Dj}=I_{Qj}-R_j \times Iq$ based on the average value ratios $R_j$ of quiescent power supply currents at a plurality of strobe points, measured values $I_{Qj}$, and an average value Iq.

By multiplying the average value Iq of the measured values by an average value ratio $R_j$, it is possible to calculate the expected value of a quiescent power supply current $I_{DDQ}$ in the case where the CMOS integrated circuit under test is good. By subtracting this expected value ($R_j \times Iq$) from a measured value $I_{Qj}$, it is possible to obtain a defect current estimate.

By calculating the absolute value $|R_{DSUM}/R_{SUM}|$ of a ratio between the summation $P_{DSUM}$ of the negative value defect current estimated value $P_{Dj}$ and the summation $R_{SUM}$ of the average value ratios $R_J$ for the strobe points corresponding to the negative value defect current estimates $P_{DJ}$, it is possible to obtain a variation $\Delta$Iq showing the difference between the average value of the measured values and the average value of FET leakage currents.

As explained above, according to the methods of testing and analyzing a CMOS integrated circuit of the present invention, it is possible to detect and analyze defect currents even with a CMOS integrated circuit with a large quiescent power supply current and large variations.

BRIEF DESCRIPTION OF THE DRAWINGS

These and other objects and features of the present invention will become clearer from the following description of the preferred embodiments given with reference to the accompanying drawings, in which:

FIG. 2 is a graph showing classifications of leakage currents of a MOSFET;

FIG. 3 is a graph illustrating the distribution of the maximum $I_{DDQ}$ in a CMOS integrated circuit;

FIG. 9 is a schematic block diagram of the configuration of a test device for the method of testing a CMOS integrated circuit according to the present invention;

FIGS. 10A to 10F are schematic flow chart for Illustrating the test method which the test device in FIG. 9 performs in relation to the average value method;

FIG. 12 is a schematic flow chart for Illustrating the test method which the test device in FIG. 9 performs in relation to the upper and lower limit method of the one point method.

DESCRIPTION OF THE PREFERRED EMBODIMENTS

Figure 1:
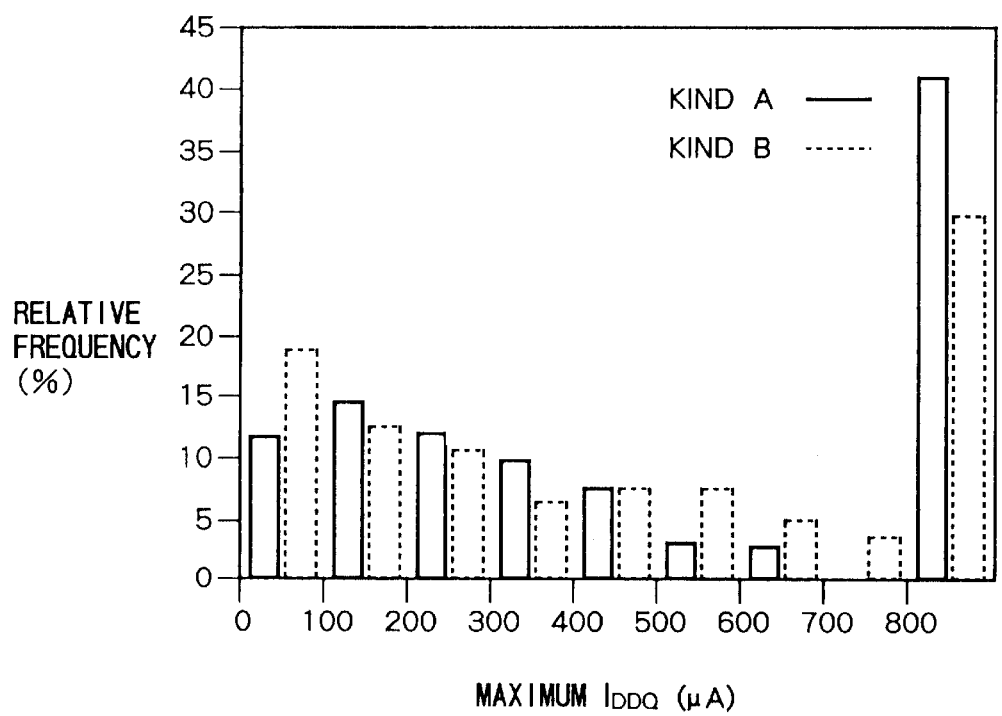
FIG. 1 is a graph illustrating the relative frequency distribution of the maximum $I_{DDQ}$ in two kinds CMOS integrated circuit.
Figure 4:
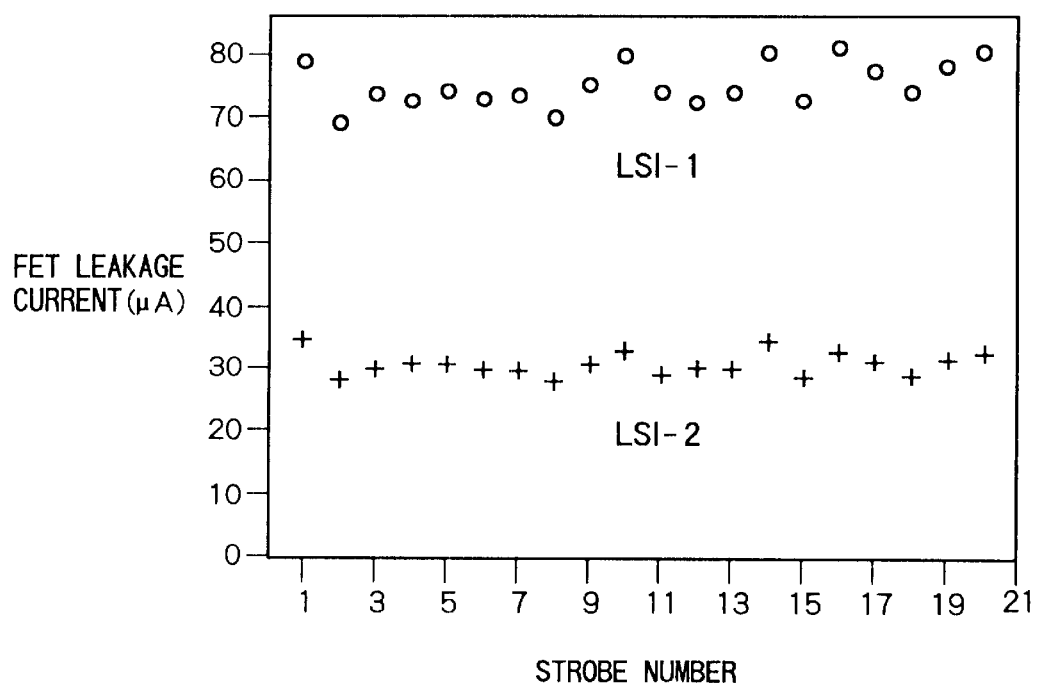
FIG. 4 is a graph of the distribution of leakage currents in two good CMOS integrated circuit.

Below, preferred embodiments will be described with reference to the accompanying drawings.

First, an average value ratio $R_j$ and the calculation of the same will be described.

The FET leakage current $I_{Tj}$ (Z =1 to $\underline{m}$) at each of m number of strobes can be expressed by the following formula (4) from the above formula (3):

$$I_{Tj} = N_{N3j} \times I_{N3} + N_{P3j} \times I_{P3} \tag{5-1}$$

$$I_t = \frac{1}{m}\sum_{j=1}^{m} I_{Tj} \tag{5-2}$$

$$= \frac{1}{m}\sum_{j=1}^{m}(N_{N3j} \times I_{N3} + N_{P3j} \times I_{P3})$$

$$= n_{N3} \times I_{N3} + n_{P3} \times I_{P3}$$

$$n_{N3} = \frac{1}{m}\sum_{j=1}^{m} N_{N3j} \tag{5-3}$$

$$n_{P3} = \frac{1}{m}\sum_{j=1}^{m} N_{P3j} \tag{5-4}$$

Here, $N_{Nij}$ and $N_{Pij}$ are made $N_{Ni}$ and $N_{Pi}$ (i=1 to 3) at the strobe number Z.

Note that $N_{Ni}$ and $N_{pi}$ are the numbers of the $\underline{n}$ type MOSFETs and $\underline{p}$ type MOSFETs where leakage currents of the case $L_i$ (i=1 to 3) occur as mentioned above.

The FET leakage current $I_{Tj}$ can be expressed by the following formula (5-1) since the case $L_3$ becomes predominant along with miniaturization. The average value It of the FET leakage currents $I_{Tj}$ can be expressed by the following formula (5-2):

$$I_{Tj} = \sum_{i=1}^{3}(N_{Nij} \times I_{Ni} + N_{Pij} \times I_{Pi}) \tag{4}$$

Here, $n_{N3}$ is the average of the number $N_{N3j}$ at all strobes (average number) as shown in the above formula (5-3). Further, $n_{P3}$ is the average of the number $N_{P3j}$ at all strobes (average number) as shown in the above formula (5-4).

The average value ratio $R_j$ is defined by the following formula (6).

$$R_j = I_{Tj}/It \tag{6}$$

When formula (5-2) is entered into formula (6), the following formula (7) is obtained:

$$R_j = \frac{N_{N3j} \times I_{N3} + N_{P3j} \times I_{P3}}{n_{N3} \times I_{P3} + n_{P3} \times I_{P3}} \tag{7}$$

$$= \frac{N_{N3j}}{n_{N3} + n_{P3} \times \frac{I_{P3}}{I_{N3}}} + \frac{N_{P3j}}{n_{N3} \times \frac{I_{N3}}{I_{P3}} + n_{P3}}$$

The numbers $N_{N3j}$ and $N_{P3j}$ are unambiguously determined by the full terminal voltage of the MOSFETs in the CMOS integrated circuit. Manufacturing variations are irrelevant. That is, if the layout of the circuitry of the CMOS integrated circuit and test pattern are the same, these numbers become the same in all CMOS integrated circuits.

In this case, the average numbers $n_{N3}$ and $n_{P3}$ become the same in all CMOS integrated circuits.

Further, the average value ratios $R_j$ become the same in all CMOS integrated circuits regardless of the size of the FET leakage currents so long as the ratio of the FET leakage currents $I_{N3}$ and $I_{P3}$ is constant.

From the above formula (6), the FET leakage current $I_{Tj}$ can be expressed by the following formula (8):

Further, the dispersion $(\sigma_T)^2$ of the FET leakage currents with respect to all strobes is expressed by the following formula (9-1), while the standard deviation $\sigma_T$ is expressed by the following formula (9-2):

$$I_{Tj} = R_j \times It \tag{8}$$

$$(\sigma_T)^2 = \frac{1}{m}\sum_{j=1}^{m}(I_{Tj} - I_t)^2 \tag{9-1}$$

$$\sigma_T = \sqrt{\frac{1}{m}\sum_{j=1}^{m}(I_{Tj} - I_t)^2} \tag{9-2}$$

When entering formula (8) into the above formulas (9-1) and (9-2), the following formulas (10-1), (10-2), and (10-3) are obtained:

$$(\sigma_T)^2 = \frac{1}{m}\sum_{j=1}^{m}(R_j \times I_t - I_t)^2 \tag{10-1}$$

$$= \frac{(I_t)^2}{m}\sum_{j=1}^{m}(R_j - 1)^2$$

$$\sigma_T = I_t\sqrt{\frac{1}{m}\sum_{j=1}^{m}(R_j - 1)^2} \tag{10-2}$$

$$= I_t \times \sigma_R$$

$$\sigma_T = \sqrt{\frac{1}{m}\sum_{j=1}^{m}(R_j - 1)^2} \tag{10-3}$$

The standard deviation $\sigma_T$ is directly proportional to the average value It of the FET leakage currents. The proportional coefficient $\sigma_R$ does not depend on the size of the FET leakage currents $I_{Tj}$.

Error or Average Value Ratio $R_j$

The reference average value ratio (standard average value ratio) $R_j^{REF}$ is obtained from circuit simulation or FET leakage current simulation or obtained from measured values etc. of the quiescent power supply currents in a plurality of good CMOS integrated circuits. When the average value It can be estimated from measurement data, the FET leakage currents $I_{Tj}$ can be calculated from the above formula (8).

The error rate (estimated error ratio) $E_{Rj}$ of the reference average value ratio $R_j^{REF}$ is defined by the following formula (11):

$$E_{Rj} = (R_j^{REF} \times It - I_{Tj})/I_{Tj} \tag{11}$$

Figure 6:
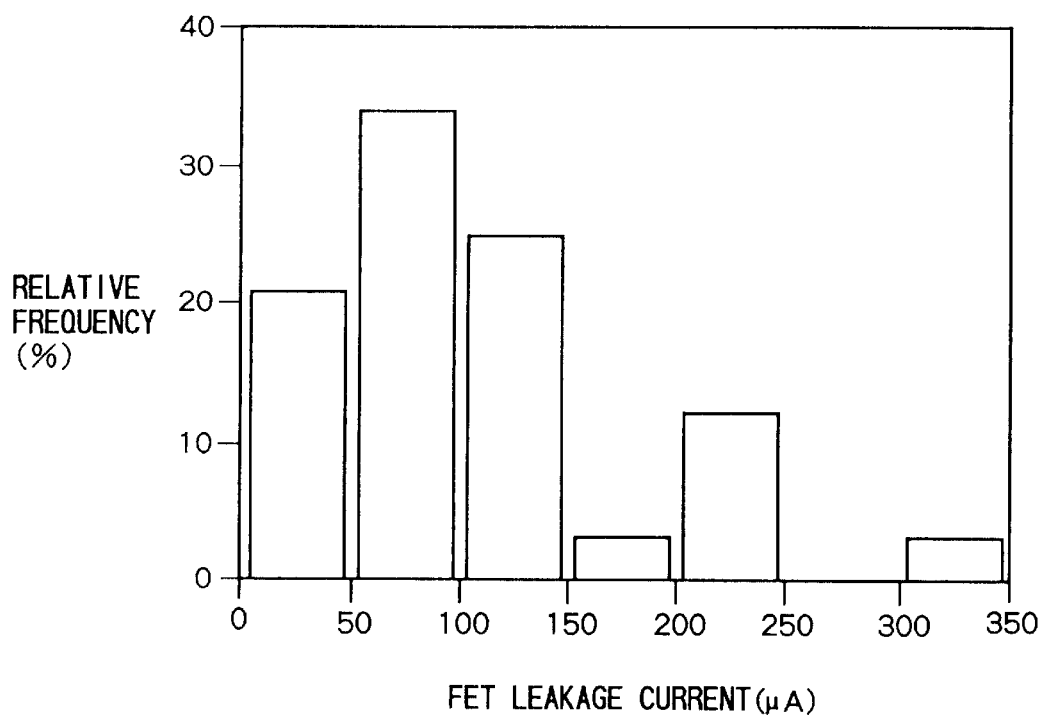
FIG. 6 is a graph illustrating the relative frequency distribution of the FET leakage current with respect to 32 good CMOS integrated circuits.
Figure 7:
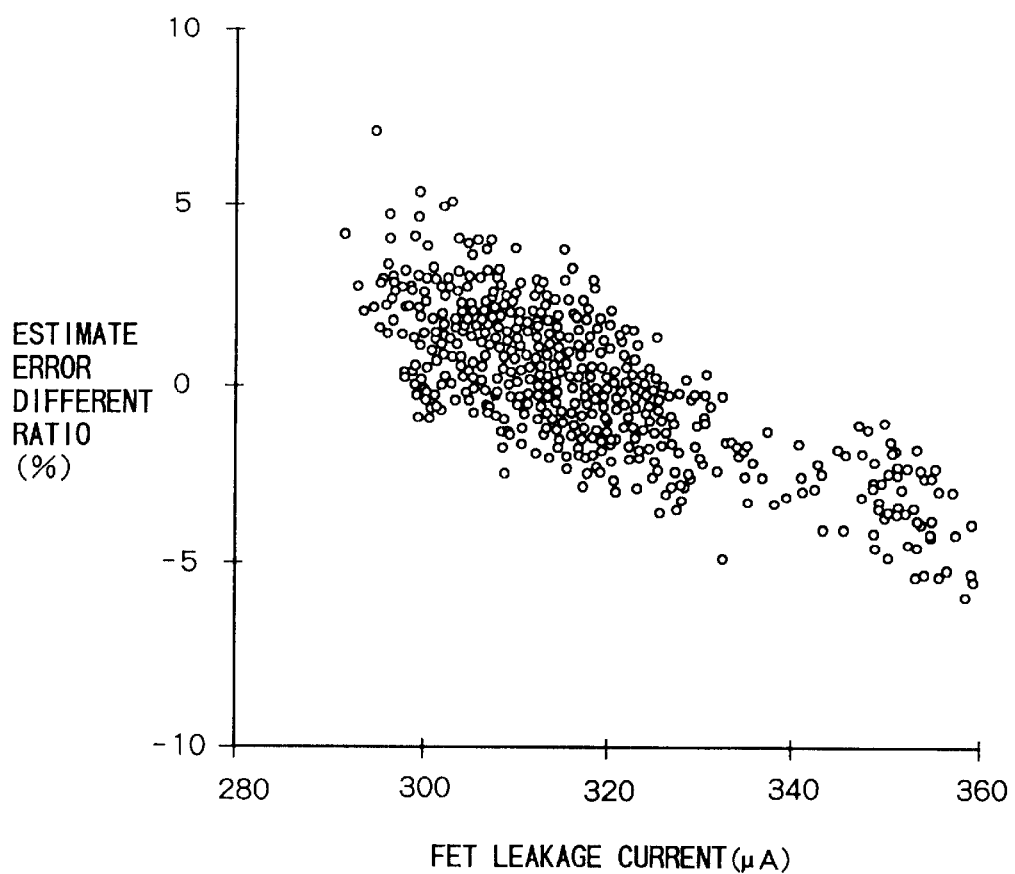
FIG. 7 is a graph of another example of distribution of an estimated error ratio of a reference average value ratio.
Figure 8:
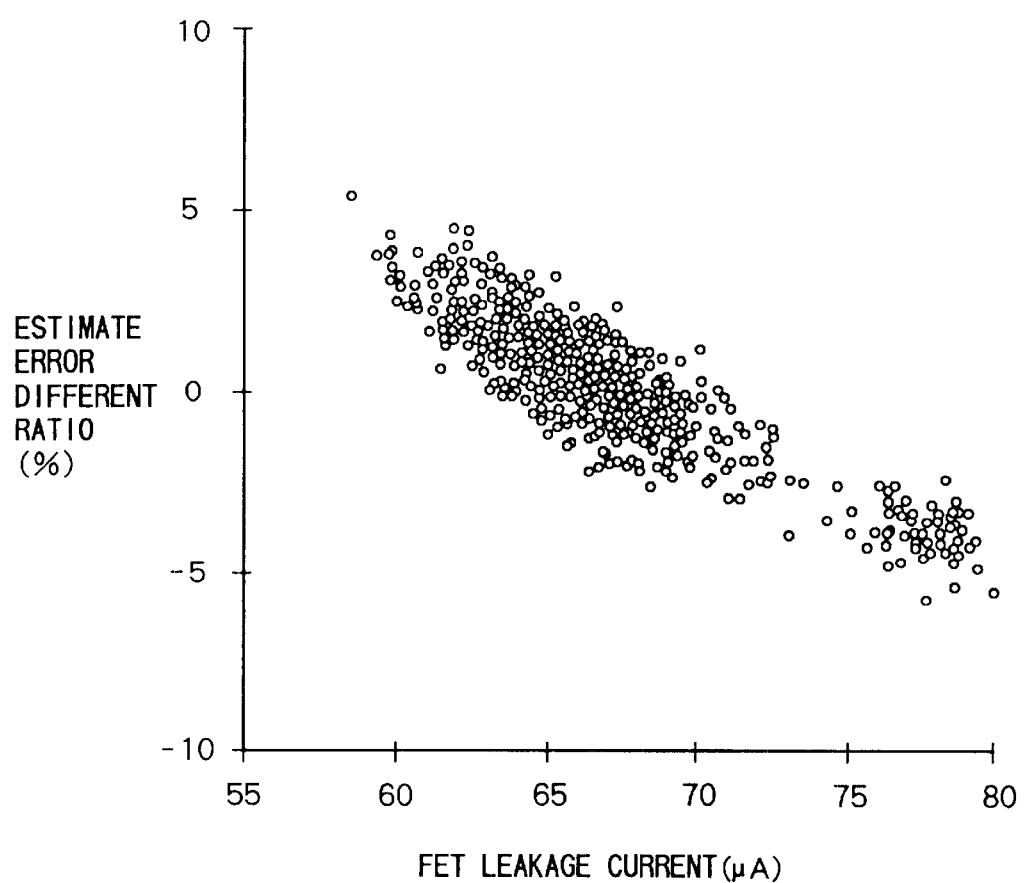
FIG. 8 is a graph of another example of distribution of an estimated error ratio of a reference average value ratio.

FIGS. 7 and 8 are charts illustrating the distributions of the estimate error rates of reference average value ratios. The average value ratios $R_j$ ( $Z=1$ to $\underline{m}$) of 32 CMOS integrated circuits of FIG. 6 were calculated for each strobe point, a reference average value ratio $R_j^{REF}$ was calculated by averaging the 32, and the estimated error rate $E_{Rj}$ of the reference average value ratio $R_j^{REF}$ was plotted by a white circle. Each plot in the figures corresponds to one strobe point. The abscissas show the FET leakage currents ($\mu$A), while the ordinates show the estimated error rates (%).

In FIG. 7, the FET leakage currents are distributed from about 290 to 360 $\mu$A. In FIG. 8, the FET leakage currents are distributed from about 58 to 80 $\mu$A. Despite the fact that the centers of the distribution differ, the estimated error rate $E_{Rj}$ is kept to within about ±6% and is constant or is almost constant without depending on the average value It.

Note that in the chart of FIG. 6, about 70 $\mu$A was the peak and the estimated error was ±4.2 (=70×6%) $\mu$A This estimated error is within 6 $\mu$A, that is, the maximum measurement error $E_M$ of an ammeter for measuring the quiescent power supply current $I_Q$.

When the estimated error rate $E_{Rj}$ is within $\pm E_R$ or when the maximum error rate comprised of the estimated error rate $E_{Rj}$ with the largest absolute value is designated as $E_R$, $(R_j^{REF} - |E_R|) \times It \leq (R_j^{REF} + |E_R|) \times It$ stands.

Note that, separate from the estimated error, the larger of the absolute value of the measurement error $E_M$ decided by the range of the ammeter of the measurement unit for measuring the quiescent power supply current $I_{DDQ}$ and the absolute value of the estimated error ($E_R \times It$) is used as the error of the criteria of judgement, that is, the allowable error E.

Average Value Method

The method of estimating the average value It of the FET leakage currents $I_{Tj}$ from the quiescent power supply current $I_Q$ which may contain a defect current is shown next.

When the above formula (1) is applied to the strobe point of the strobe number Z (strobe point Z), the measured values $I_{Qj}$ corresponding to the strobe point Z is shown by the following formula (12-1), the average value Iq of the measured values $I_{Qj}$ at all strobe points is shown by the following formula (12-2), and the $\Delta$Iq shown by the following formula (12-3) can be obtained.

$$I_{Qj} = I_{Tj} + I_{Dj} \tag{12-1}$$

$$I_q = \frac{1}{m}\sum_{j=1}^{m} I_{Qj} \tag{12-2}$$

$$= \frac{1}{m}\sum_{j=1}^{m}(I_{Tj} + I_{Dj})$$

$$= \frac{1}{m}\sum_{j=1}^{m} I_{Tj} + \frac{1}{m}\sum_{k=1}^{d} I_{Dk}$$

$$= I_t + \Delta I_q$$

$$\Delta I_q = \frac{1}{m}\sum_{k=1}^{d} I_{Dk} \tag{12-3}$$

Here, $I_{Dk}$ ($\underline{k}$=1 to $\underline{d}$) is the defeat current $I_D$ at a succession of $\underline{d}$ number of strobe points among the $\underline{m}$ number of the strobe points.

Further, $\Delta$Iq is the defect current averaged for the number of points m. As shown in the above formula (12-2), it may be considered the variation superposed on the average value It of the FET leakage currents at the average value Iq.

Moreover, the average value It of the FET leakage currents can be expressed by the following formula (13).

$$It = Iq - \Delta Iq \quad (13)$$

When entering the above formula (13) in formula (8), $I_{Tj} R_j \times (Iq - \Delta Iq)$ can be obtained. When applying this formula to the above formula (2), the following formula (14) can be obtained:

$$I_{Dj} = I_{Qj} - R_j \times (Iq - \Delta Iq)$$

$$= I_{Qj} - R_j \times Iq + R_j \times \Delta Iq \quad (14)$$

Here, the defect current estimated value $P_{Dj}$ is defined as $P_{Dj} = I_{Qj} - R_j \times Iq$.

This defect current estimated value $P_{Dj}$ can be calculated during the testing of the CMOS integrated circuit from an average value ratio $R_j$ calculated in advance and the measured quiescent power supply current $I_Q$ (measured value $I_{Qj}$).

From the above formula (14), the following formula (15) can be obtained regarding the defect current estimate $P_{DJ}$:

$$P_{Dj} = I_{Dj} - R_j \left( \frac{1}{m} \sum_{k=1}^{d} I_{Dk} \right) \quad (15)$$

The right side of the above formula (15) depends on only the defect current at the strobe point, the constant $R_j$, the summation of the defect currents, and the total number m of the strobe points and does not depend on the measured value $I_{Qj}$ of the quiescent power supply current and the average value Iq.

The defect current estimated value $P_{Dj}$ becomes smaller from the defect current $I_{Dj}$ by exactly the second term when there is a defect current $I_{Dj}$ at the strobe point Z.

On the other hand, when there is no defect current at the strobe point Z, the defect current estimate becomes a negative value of the amount of the second term of the right side and shows that a defect current is flowing at other than the strobe point Z.

In this way, when the defect current estimated value $P_{Dj}$ is above E, it means that there is a defect current at the strobe point Z, while when the defect current estimated value $P_{DJ}$ is below −E, it means that there is a defect current at other than the strobe point Z.

Here, the value of the allowable error E used for comparison is made for example the value $\max(|E_R \times Iq|, |E_H|)$ of the larger of the absolute value of $E_R \times Iq$ and the absolute value of the maximum measurement error $E_M$.

The condition for judging the CMOS integrated circuit as good may also be made that $-E \leq P_{Dj} \leq E$ stands for all strobe points.

However, when there is a defect current of the same size at all strobe points, the following formula (16) can be obtained as a special case from the above formula (15). Here, $I_{Dk}$ is $I_D$ and $\underline{d}$ is $\underline{m}$.

$$P_{Dj} = (1 - R_j) \times I_D \quad (16)$$

Therefore, the defect current estimate $P_{Dj}$ becomes the maximum at the strobe point $\underline{s}$ where the average value ratio $R_j$ becomes the smallest value $R_s$. Further, the minimum value $I_{DMIN}$ of the defect currents $I_D$ can be expressed by the following formula (17):

$$I_{DMIN} = E/(1 - R_s) \quad (17)$$

Defect Current Value

When the defect rate unusually rises in the testing of CMOS integrated circuits or when controlling good or defective, detection of the defect current value is often needed.

In the above formula (15), when finding the negative value defect current estimates $P_{DJ}$, that is, the sums $P_{DSUM}$ of the defect current estimates $P_{Dj}$ at strobe points $\underline{h}$ (=1 to q) where there is no defect current, the following formulas (18-1), (18-2), and (18-3) can be obtained:

$$P_{DSUM} = \Delta I \sum_{h=1}^{g} Rh \quad (18\text{-}1)$$

$$\Delta I_q = \frac{-P_{DSUM}}{R_{SUM}} \quad (18\text{-}2)$$

$$R_{SUM} = \sum_{h=1}^{g} Rh \quad (18\text{-}3)$$

The value of the above formula (18-3) is the summation $R_{SUM}$ of the average value ratios $R_h$ at the strobe points $\underline{h}$ (=1 to q) and can be calculated, therefore it is also possible to calculate $\Delta Iq$.

Thus, the following formula (19) can be obtained at the strobe points $\underline{k}$ (=1 to d) where the defect current estimated value $P_{Dj}$ are above 0 by using the above formula (15), and the defect currents $I_{Dk}$ can be calculated.

$$I_{Dk} = P_{Dk} + R_k \times \Delta Iq \quad (19)$$

Amplitude Ratio Method

Here, the value of the quiescent power supply current $I_Q$ at the strobe point $\underline{b}$ where the average value ratio $R_j$ becomes the biggest value (biggest average value ratio) $R_b$ among all strobe points is designated as $I_{Qb}$, while the value of the quiescent power supply current $I_Q$ at the strobe point where the average value ratio $R_j$ becomes the smallest value (smallest average value ratio) $R_s$ is designated as $I_{Qs}$.

Further, the quiescent power supply current $I_{Qb}$ is assumed to have the FET leakage current $I_{Tb}$ and the defect current $I_{Db}$, and the quiescent power supply current $I_{Qs}$ is assumed to have the FET leakage current $I_{Ts}$ and defect current $I_{Ds}$.

The amplitude ratio $R_{SQ}$ of the amplitude difference of the quiescent power supply currents $I_{Qb}$ and $I_{Qs}$ at the strobe points $\underline{b}$ and $\underline{s}$ and the average value Iq is expressed by the following formula (20):

$$R_{SQ} = (I_{Qb} - I_{Qs})/Iq$$

$$= \{(I_{Tb} + I_{Db}) - (I_{Ts} + I_{Ds})\}/Iq \quad (20)$$

The amplitude ratio $R_{SQ}$ when the same defect current $I_D$ exists at all the strobe points is shown by the following formula (21):

$$R_{SQ} = \{(I_{Tb} + I_D) - (I_{Ts} + T_D)\}/Iq \quad (21)$$
$$= (I_{Tb} - I_{Ts})/(It + I_D)$$
$$= (R_b - R_s) \times It/(It + I_D)$$

If $R_{ST}$ is defined as being equal to $R_b-R_s$ and the amplitude ratio variation rate $P_{STQ}$ is defined as $R_{ST}/R_{SQ}$, this amplitude ratio variation rate $P_{STQ}$ can be calculated during testing and the following formula (22) can be obtained from the above formula (21):

$$P_{STQ} = 1 + I_D/It \quad (22)$$

From the above formula (22), an amplitude ratio variation rate $P_{STQ}$ of above 1 can be used as the condition to show the existence of a defect current $I_D$, and a CMOS integrated circuit can be judged as a defect based on this.

On the other hand, an amplitude ratio variation rate $P_{STQ}$ of less than or equal to 1 can be used as the condition to show the lack of a defect current $I_D$, and a CMOS integrated circuit can be judged as good based on this.

By entering $It=Iq-I_D$ into the above formula (22), the following formula (23) can be obtained and the defect current $I_D$ can be found.

$$I_D = (1 - 1/P_{STQ}) \times Iq \quad (23)$$

One Point Method

In the average value method, the measured values of the quiescent power supply currents are averaged until obtaining the necessary judgment error, so m number of strobe points are necessary.

However, although the accuracy is reduced, the average value It of the FET leakage currents $I_{Tj}$ can also be estimated from one measured value of the quiescent power supply current $I_Q$.

First, a ratio $R_{Qj}$ of a quiescent power supply current $I_{Qj}$ and an average value ratio $R_j$ is set as $R_{Qj}=I_{Qj}/R_j$.

When using the one point method at the first strobe point, that is, where Z is 1, the following formula (24) can be obtained. Note that the ratio $R_{Q1}$ corresponds to the prediction of the average value Iq of measured values $I_{Qj}$.

$$R_{Q1} = I_{Q1}/R_{Q1} \quad (24)$$
$$= (I_{T1} + I_{D1})/R_1$$
$$= (I_{T1}/R_1) + (I_{D1}/R_1)$$

Here, since It is $I_{T1}/R_1$, the following formula (25) can be obtained from the above formula (24):

$$It = R_{Q1} - I_{D1}/R_1 \quad (25)$$

Further, since $I_{Qj}$ is $I_{Tj}+I_{Dj}$, the following formula (26) can be obtained from the above formula (25):

$$I_{Dj} = I_{Qj} - I_{Tj} \quad (26)$$
$$= I_{Qj} - R_j \times It$$
$$= I_{Qj} - R_j \times (R_{Q1} - I_{D1}/R_1)$$
$$= I_{Qj} - R_j \times R_{Q1} + R_j \times (I_{D1}/R_1)$$

Here, when the defect current prediction $P_{Q1j}$ is defined as $I_{Qj}-R_j \times R_{Q1}$, the following formula (27) can be obtained from the above formula (26):

$$R_{Q1j} = I_{Qj} - R_j \times R_{Q1} \quad (27)$$
$$= I_{Dj} - R_j \times (I_{D1}/R_1)$$

From formula (27), the defect current prediction $P_{Q1j}$ becomes a value which depends on only the defect current $I_{Dj}$ at a strobe point Z, the defect current $I_{D1}$ at the first strobe point, the average value ratio $R_1$ at the first strobe point, and an average value ratio $R_j$ and does not depend on the measured values of the quiescent power supply currents or the average value Iq thereof.

Here, when the defect currents $I_{D1}$ is 0, the condition for detection of a defect current at the strobe point becomes $P_{Q1j} > E$.

When the defect current $I_{D1}$ is not 0, if $P_{Q1j}$ is above E, there is a defect current $I_{Dj}$ at the strobe point Z.

When $P_{Q1j}$ is below $-E$, there is a defect current $I_{Dj}$ at a strobe point other than the strobe point Z.

Note that the allowable error E used for comparison is made the value $\max(|E_R \times R_{Q1}|, |E_H|)$ of the larger of the absolute value of $E_R \times R_{Q1}$ and the absolute value of the maximum measurement error $E_M$.

Upper and Lower Limit Method

Figure 5:
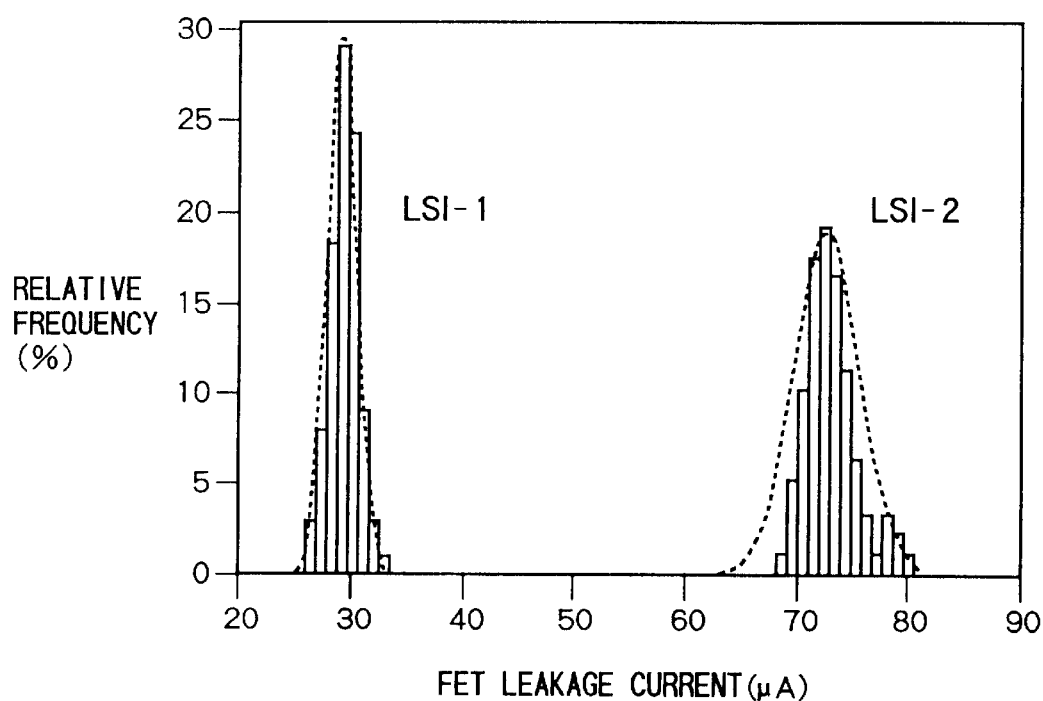
FIG. 5 is a graph of the relative frequency distribution of the FET leakage currents at all strobe points in the CMOS integrated circuit of FIG. 4.

When the FET leakage currents are distributed by the normal distribution or similar to the normal distribution as shown in FIG. 5, each FET leakage current $I_{Tj}$ is within about five or six times the standard deviation $\sigma_T$ from the average value. This may be utilized to judge the good or defective of the CMOS integrated circuit.

In the upper and lower limit method, an upper limit threshold $I_{QU}$ and lower limit threshold $I_{QL}$ are set as shown in the following formulas (28-1) and (28-2) by using a proportional coefficient $\sigma_R$ of the above formula (10-3):

$$I_{QU} = (1 + 6\sigma_R) \times R_{Q1} \quad (28-1)$$
$$= (1 + 6\sigma_R) \times I_{Q1}/R_1$$

$$I_{QL} = (1 - 6\sigma_R) \times R_{Q1} \quad (28-2)$$
$$= (1 - 6\sigma_R) \times I_{Q1}/R_1$$

In the upper and lower limit method, it is possible set the upper limit threshold $I_{Qu}$ and the lower limit threshold $I_{QL}$ based on the measured value at the first strobe point and therefore test at a high speed.

However, it is difficult to detect a defect current present in a CMOS integrated circuit having the lowest limit FET leakage current when the defect current is less than the range of the upper and lower limits ($I_{QU} - I_{QL}$) therefore this is effective when the range is small.

Testing Device

FIG. 9 is a schematic block diagram of the configuration of a testing device for the test method of CMOS integrated circuit according to the present invention.

This testing device 100 has a control unit 21, a signal drive unit 31, a measurement unit 32, a measured $I_{DDQ}$ table memory 41, an average value ratio table memory 42, a good or defective judgement unit 43, an output-unit 44, and first to third memories 11 to 13.

The first memory 11 stores test pattern information, that is, information for showing a test pattern TP used for $I_{DDQ}$ testing, and strobe information, that is, information showing strobe points being measured.

The second memory 12 stores the information of the average value ratios $R_j$ ($R_j^{REF}$) found from the PET leakage current simulation before testing or the information of the average value ratios $R_j$ ($R_j^{REF}$) found from measured values $I_{Qj}$ obtained by measuring the quiescent power supply currents $I_Q$ of a plurality of good CMOS integrated circuits.

The third memory 13 stores information for showing estimated error corresponding to the average value ratios $R_j$ ($R_j^{REF}$) stored in the second memory or the estimated error rates $E_{Rj}$ and information for showing the maximum measurement error $E_M$ of the measurement unit 32.

The control unit 21 is a controller for controlling the entire testing device 100.

The control unit 21 is supplied with information showing the test pattern and information showing the strobe points from the first memory 11, information showing the average value ratios from the second memory 12, and information showing the estimated errors or the estimated error rates $E_{Rj}$ and information showing the maximum measurement error $E_M$ from the third memory 13.

The control unit 21 supplies the information showing the test pattern and information showing the strobe points to the signal drive unit 31.

Further, the control unit 21 converts the information showing the average value ratios into an 25 average value ratio table and supplies it to the average value ratio table memory 42.

Moreover, the control unit 21 supplies the information showing the estimated errors or the estimated error rates $E_{Rj}$ and information showing the maximum measurement error $E_M$ of the measurement unit 32 to the good or defective judgement unit 43.

The signal drive unit 31 applies a test signal of a predetermined test pattern to a CMOS integrated circuit 50 under test under the control of the control unit 21.

Further, the signal drive unit 31 supplies a timing signal showing the strobe points (strobe pulses) to the measurement unit 32 when a test signal is applied.

The measurement unit 32 measures the quiescent power supply currents $I_Q$ of the CMOS integrated circuit 50 according to the strobe pulses, converts the measured values $I_{Qj}$ into the measured $I_{DDQ}$ table, and supplies it to and stores it in the measured $I_{DDQ}$ table memory 41.

The measured $I_{DDQ}$ table memory 41 and the average value ratio memory 42 are constituted by memories readable at a high speed by designating the strobe number Z.

The control unit 21 activates the good or defective judgement unit 43 when finishing storing the measured values $I_{QJ}$ for all the strobe points or the measured values $I_{Qj}$ for predetermined strobe points.

The good or defective judgement unit 43 judges the good or defective of the CMOS integrated circuit 50 based on the average value ratios $R_j$ ($R_j^{REF}$) and the measured values $I_{Qj}$ etc. and outputs a judgement signal showing the measurement results, judgement results, various calculation results, etc. to the output unit 44.

The output unit 44 has a display, printer, or other output device and displays on a display screen or prints on a print medium the measurement results, judgement results, various calculation results, etc. based on the judgement signal from the good or defective judgement unit 43.

The output unit 44 may also be constituted by a computer display and the control unit 21, the measured $I_{DDQ}$ table memory 41, the average value ratio table memory 42, and the good or defective judgement unit 43 may be constituted by a computer or a microcomputer. The control unit 21 and the good or defective judgement unit 43 may also be provided as a single unit.

Operation of Test Device 100

Next, the method of testing a CMOS integrated circuit which the test device 100 performs will be explained.

Figure 10A:
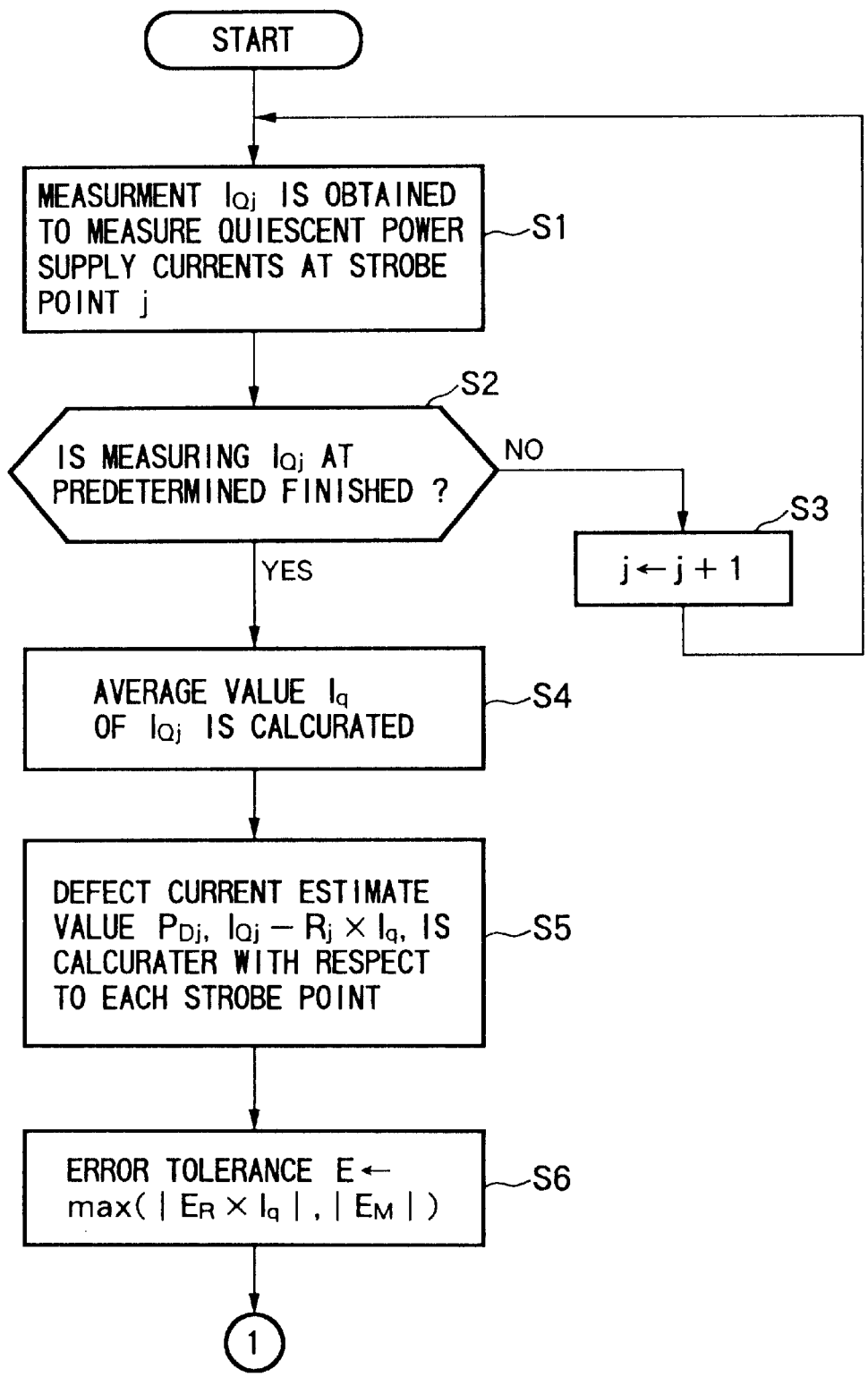
Figure 10B:
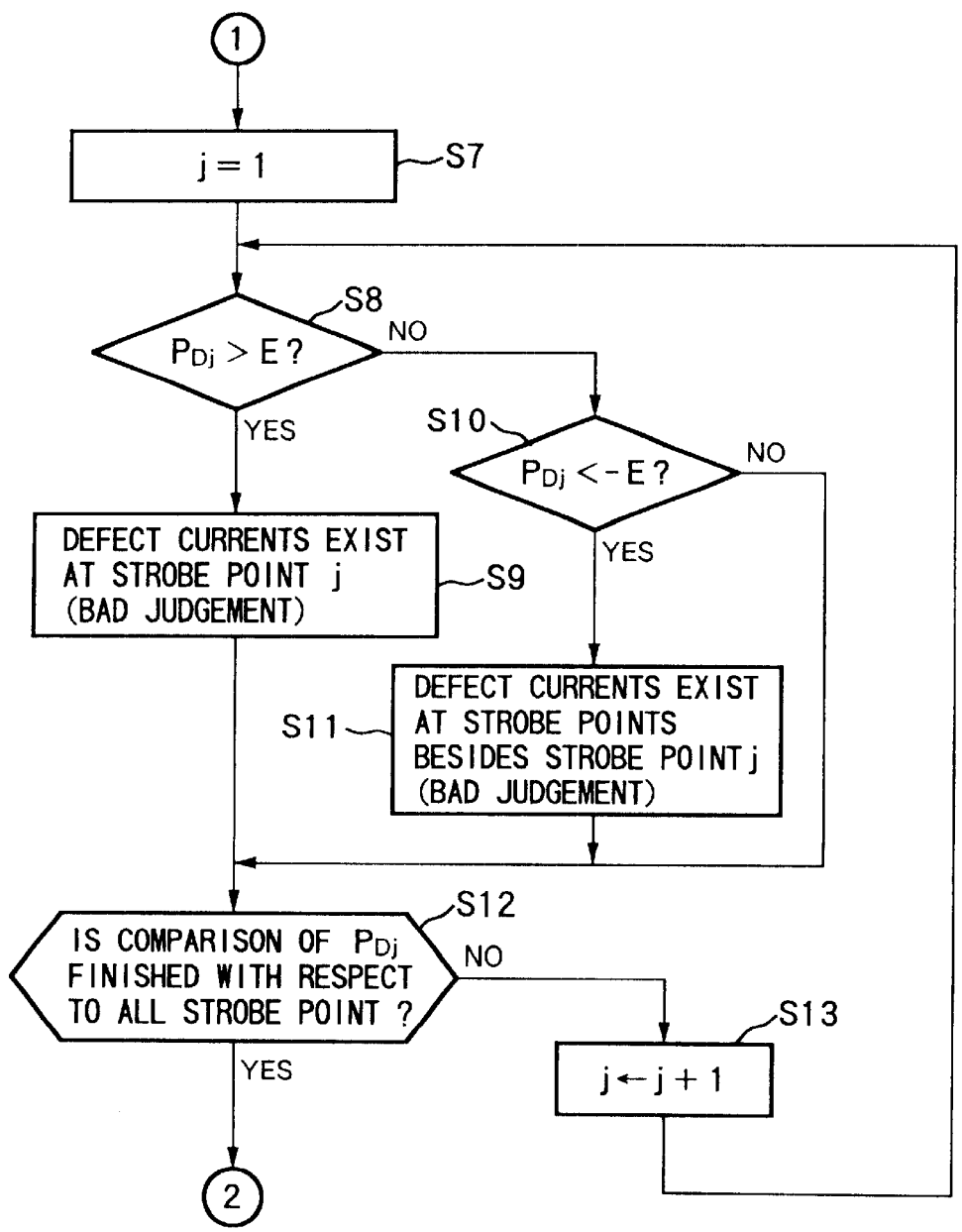

FIGS. 10A to 10C are schematic flow charts illustrating the test method which the test device 100 performs in relation to the average value method.

The test device 100 is made one for which the reference average value ratios $R_j^{REF}$ and the error rates (estimated error rates) $E_{Rj}$ have been calculated in advance for a predetermined number of samples of CMOS integrated circuits and one for which the maximum measurement error $E_M$ is known in advance. Further, the reference average value ratios $R_j^{REF}$ are used as the average value ratios $R_j$ when testing.

First, at the start, the value of the strobe point variable is initially set to "1", where after the routine proceeds to step S1.

At step S1, the signal drive unit 31 applies a test signal of a predetermined test pattern to the CMOS integrated circuit 50, and the measurement unit 32 measures the quiescent power supply currents at the strobe points Z to obtain the measured values $I_{Qj}$.

At step S2, the control unit 21 judges whether measurement of the quiescent power supply currents at all of the predetermined strobe points Z (=1 to m) has finished.

When the predetermined measurement has been finished, the measured values $I_{Qj}$ are stored in the table memory 41 and supplied to the good or defective judgement unit 43, where after the routine proceeds to step S4.

When the predetermined measurement has not been finished, the routine proceeds to step S3, where the value of Z is incremented to increase it by exactly "1", where after the routine returns to step S1 where the next measurement is performed.

At step S4, the good or defective judgement unit 43 calculates the average value Iq of the plurality of measured values $I_{Qj}$ (Z=1 to m) obtained from the CMOS integrated circuit 50 at the strobe points.

The average value Iq is $(I_{Q1}+I_{Q2}+...+I_{Qm})/m$. Note that, for example, m is made at least 2. The value of m may even be set to about 800 as an example.

It is also possible not to average all the measured values $I_{Qj}$ but rather to represent this by the average of the measured values of the first n number of strobe points. For example, n may be an integer larger than 2, n is less than m, and Iq may then be $(I_{Q1}+I_{Q2}+...+I_{Qn})/n$.

At step S5, the good or defective judgement unit 43 calculates the corresponding defect current estimate $P_{Dj}=I_{Qj}-R_j \times Iq$ for each strobe point Z (Z =1 to m).

At step S6, the good or defective judgement unit 43 calculates the allowable error E. The allowable error E is made the larger of the absolute value of the estimated error rate $E_R \times Iq$ and the absolute value of the maximum measurement error $E_M$.

At step S7, the good or defective judgement unit 43 sets the strobe point variable Z to "1".

At step S8, the good or defective judgement unit 43 compares the defect current estimated value $P_{Dj}$ with the allowable error E.

When $P_{Dj}$ is greater than E, the routine proceeds to step S9, where the good or defective judgement unit 43 detects that there is a defect current at the strobe point Z and judges that the CMOS integrated circuit 50 under test is a defect, the output unit 44 outputs the judgement results etc., and the test ends. Note that it is also possible to judge the existence of a defect current for all the strobe points.

When $P_{Dj}$ is less than E, the routine proceeds to step S10.

At step S10, the good or defective judgement unit 43 compares the defect current estimated value $P_{Dj}$ with −E.

When $P_{Dj}$ is below −E, the routine proceeds to step 11, where the good or defective judgement unit 43 detects that there is a defect current at a strobe point other than the strobe point Z and judges that the CMOS integrated circuit 50 under test is a defect, the output unit 44 outputs the judgement results etc., and the test ends. Note that it is also possible to judge the existence of a defect current for all the strobe points.

When $P_{Dj}$ is not below −E, the routine proceeds to step S12.

At step 12, the good or defective judgement unit 43 judges whether or not the comparison of the defect current estimated value $P_{Dj}$ has been finished for all the strobe points.

When the comparison is not finished, the routine proceeds to step 13, where the value of the variable Z is incremented to increase it by exactly "1", then the test returns to step S8 where the next comparison is performed.

When the comparison is finished, the routine proceeds to step 14.

At step 14, the amplitude ratio variation rate $P_{STQ}$ is calculated. $P_{STQ}$ is $Iq \times (R_b - R_s)/(I_{Qb} - I_{Qs})$.

Note that the average value ratio $R_b$ is the biggest value of the average value ratio $R_j$. The measured value at the strobe point $\underline{b}$ at this time is $I_{Qb}$.

Moreover, the average value ratio $R_s$ is the smallest value of the average value ratio $R_j$. The measured value at the strobe point $\underline{s}$ at this time is $I_{Qs}$.

At step 15, the good or defective judgement unit 43 judges whether or not the amplitude ratio variation rate $P_{STQ}$ is greater than 1.

When $P_{STQ}$ is above 1, the good or defective judgement unit 43 detects that there is a defeat current at all the strobe points Z (=1 to $\underline{m}$) and judges that the CMOS integrated circuit 50 under test is a defect, the output unit 44 outputs the judgement results etc., and the test ends.

When $P_{STQ}$ is not greater than 1, the routine proceeds to step 17, where the good or defective judgement unit 43 judges that the CMOS integrated circuit 50 under test is good, the output unit 44 outputs the judgement results etc., and the test ends.

Next, the method of analyzing a CMOS integrated circuit will be explained.

Figure 10D:
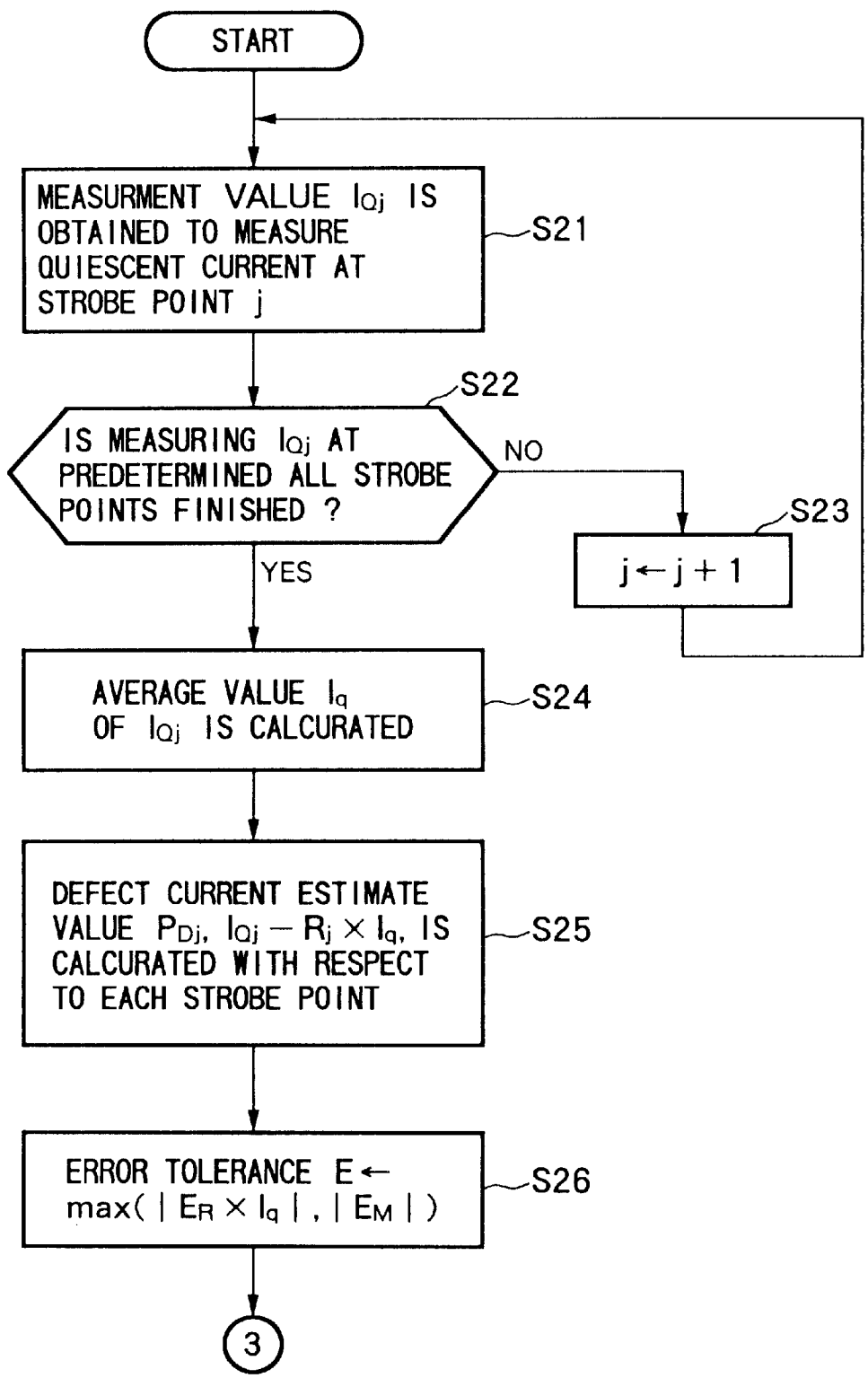
Figure 10E:
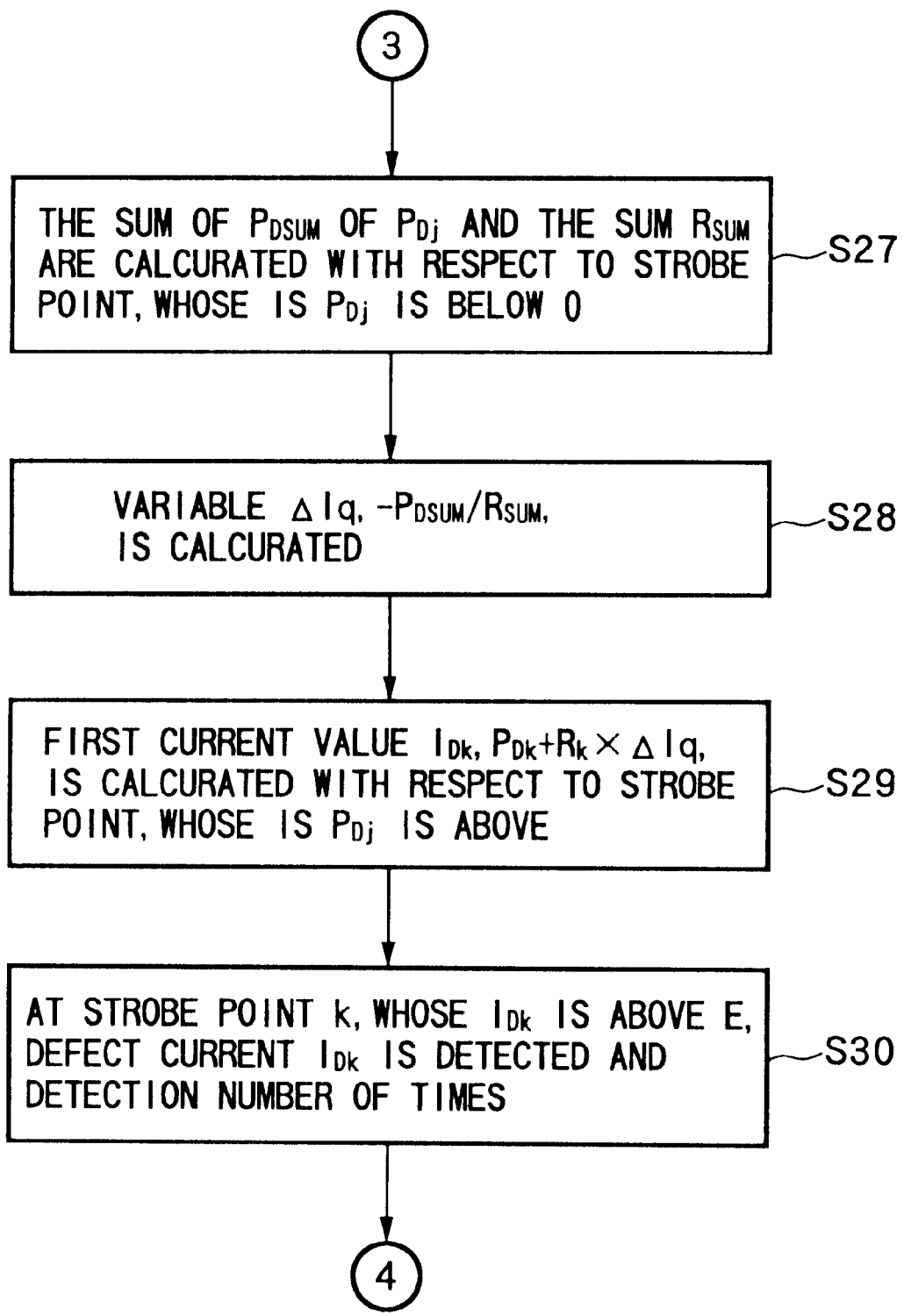
Figure 10F:
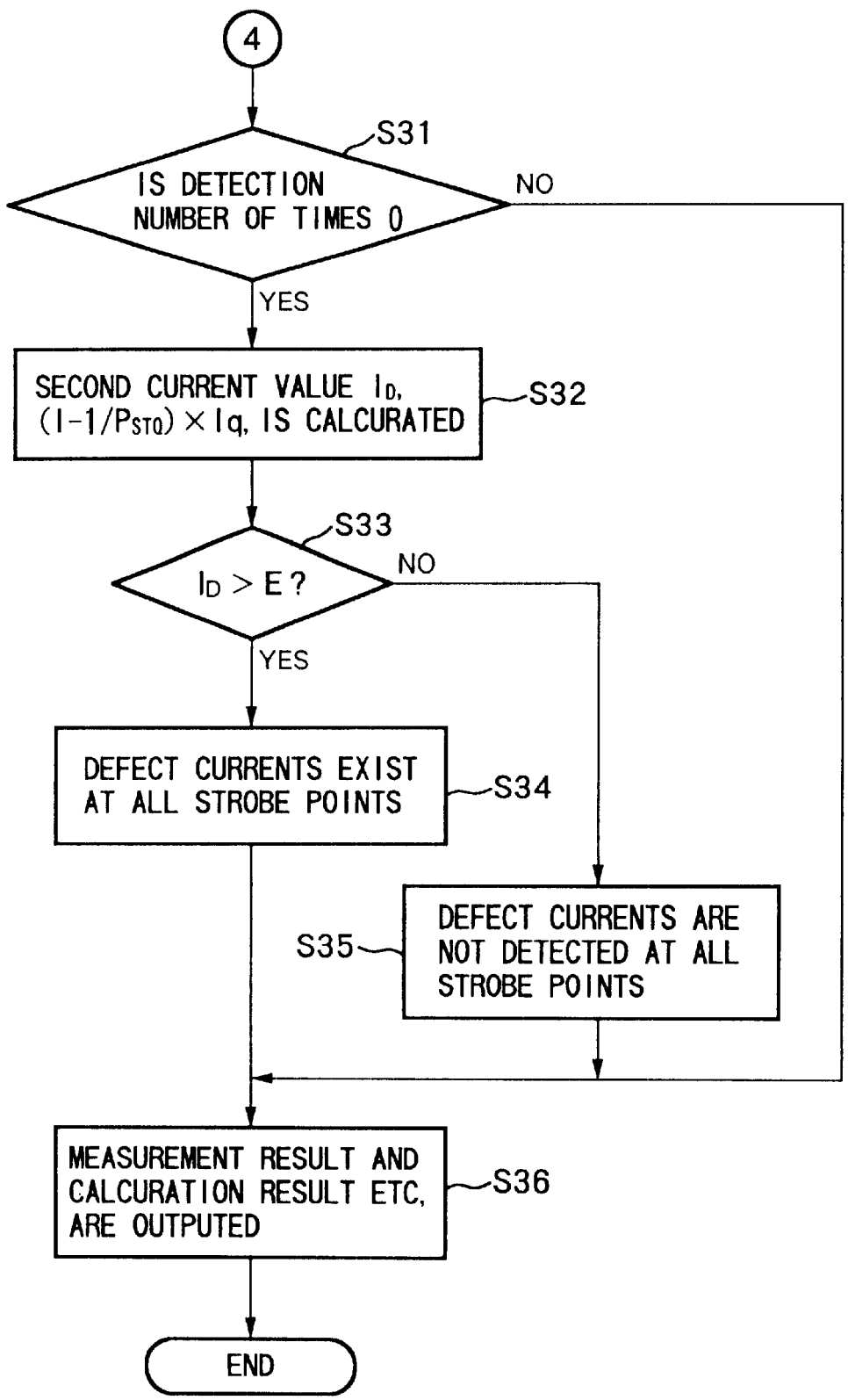

FIGS. 10D to 10F are schematic flow charts illustrating the analyzing method which the test device 100 performs in relation to the average value method.

First, at the start, the value of the strobe point variable Z is initially set to "1", where after the routine proceeds to step S21.

At step S21, the signal drive unit 31 applies a test signal of a predetermined test pattern to the CMOS integrated circuit 50, and the measurement unit 32 measures the quiescent power supply currents at the strobe points Z to obtain the measured values $I_{Qj}$.

At step S22, the control unit 21 judges whether measurement of the quiescent power supply currents at all of the predetermined strobe points Z (=1 to $\underline{m}$) has finished.

When the predetermined measurement has been finished, the measured values $I_{Qj}$ are stored in the table memory 41 and supplied to the good or defective judgement unit 43, where after the routine proceeds to step S24.

When the predetermined measurement has not been finished, the routine proceeds to step S23, where the value of Z is incremented to increase it by exactly "1", where after the routine returns to step S21 where the next measurement is performed.

At step S24, the good or defective judgement unit 43 calculates the average value Iq of the plurality of measured values $I_{Qj}$ (Z=1 to $\underline{m}$) obtained from the CMOS integrated circuit 50 at the strobe points.

The average value Iq is $(I_{Q1} + I_{Q2} + \ldots + I_{Qm})/m$. Note that, for example, $\underline{m}$ is made at least 2. The value of $\underline{m}$ may even be set to about 800 as an example.

At step S25, the good or defective judgement unit 43 calculates the corresponding defect current estimated values $P_{Dj} = I_{Qj} - R_j \times Iq$ for each strobe point Z (Z =1 to $\underline{m}$).

At step S26, the good or defective judgement unit 43 calculates the allowable error E. The allowable error E is made the larger of the absolute value of the estimated error rate $E_R \times Iq$ and the absolute value of the maximum measurement error $E_M$.

At step S27, the good or defective judgement unit 43 calculates the summation $P_{DSUM}$ of the defeat current estimates $P_{Dj}$ and the summation $R_{SUM}$ of the average value ratios $R_j$ ($R_j^{REF}$) for the strobes $\underline{h}$ having defect current estimates $P_{Dj}$ of a negative value.

At step S28, the good or defective judgement unit 43 calculates the variation $\Delta Iq$ of the average value Iq. $\Delta Iq$ is $-P_{DSUM}/R_{SUM}$.

At step S29, first current values $I_{Dk}$ are calculated for strobes $\underline{k}$ having defect current estimates $P_{Dj}$ larger than the allowable error E. A first current value $I_{Dk}$ is $P_{Dk} + R_k \times \Delta Iq$.

At step S30, strobe points k having calculated first current values $I_{Dk}$ above the allowable error E are detected as including defect currents shown by the first current values $I_{Dk}$ and the number of times of detection of the defect currents is counted.

At step 31, whether or not the number of times of detection of the defect currents is 0 is judged.

When the number of times of detection is not 0, the routine proceeds to step S36.

When the number of times of defection is 0, the routine proceeds to step S32 where a second current value $I_D$ is calculated.

The second current value $I_D$ is $(1 - 1/R_{STD}) \times Iq$.

At step 33, whether the second current value $I_D$ is larger than the allowable error E is judged.

When the second current value $I_D$ is over E, the routine proceeds to step S34 where the fact that there is a defect current shown by the second current value $I_D$ at all the strobe points is detected.

When the second current value $I_D$ is not over E, the routine proceeds to step S35 where there is no defect current at any strobe point is detected.

At step S36, the output unit 44 displays or prints out the measurement results of the CMOS integrated circuit 50, or calculation results of the defect current value, etc.

Figure 11A:
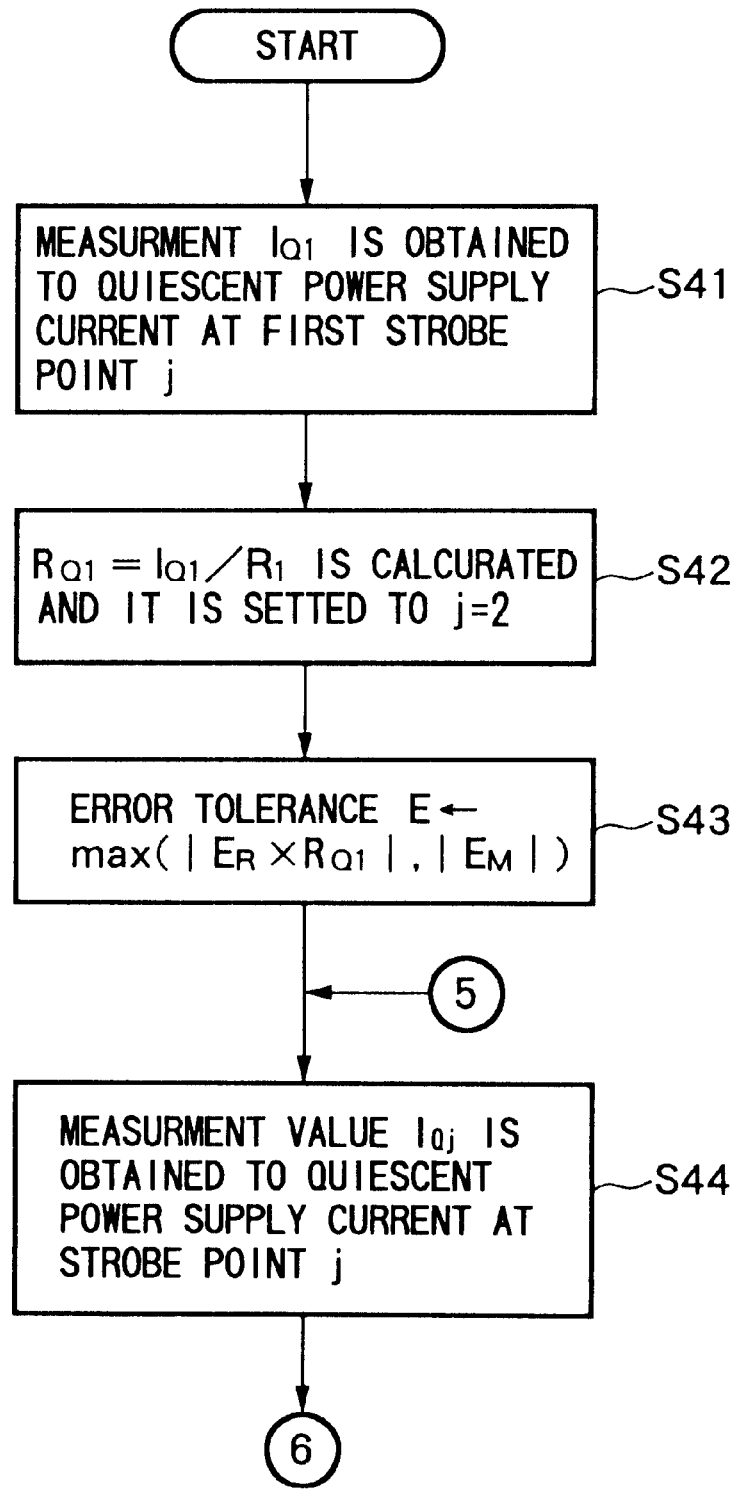
FIGS. 11A and 11B are schematic flow chart for illustrating the test method which the test device in FIG. 9 performs in relation to the one point method.
Figure 11B:
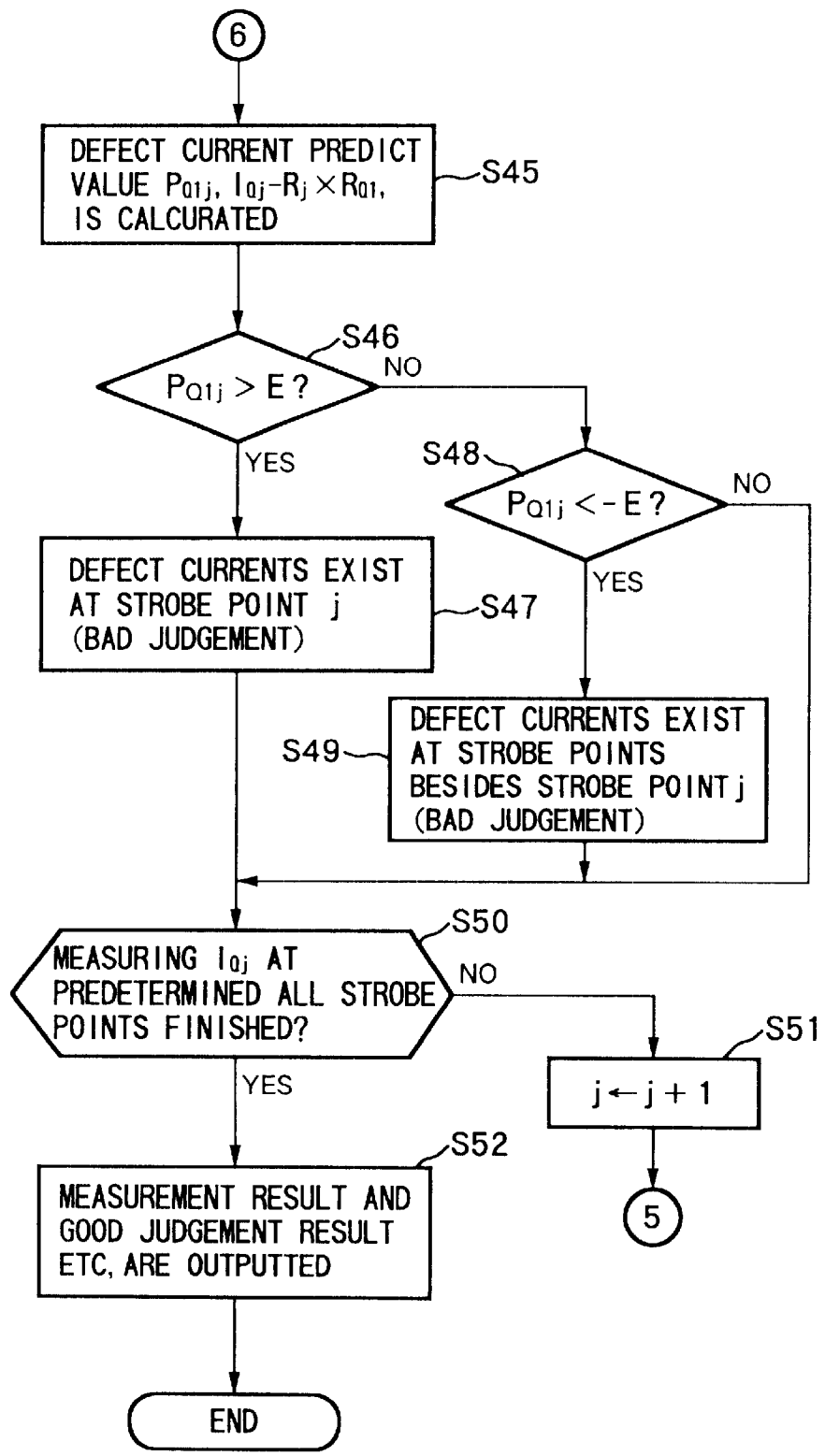

FIGS. 11A and 11B are schematic flow charts illustrating the test method which the test device 100 performs in relation to the one point method.

The test device 100 is made one for which the reference average value ratios $R_j^{REF}$ and the estimated error rates $E_{Rj}$ have been calculated in advance for a predetermined number of samples of CMOS integrated circuits and one for which the maximum measurement error $E_M$ is known in advance. Further, the reference average value ratios $R_j^{REF}$ are used as the average value ratios $R_j$ when testing.

First, at step S41, the signal drive unit 31 applies a test signal of a predetermined test pattern to the CMOS integrated circuit 50, and the measurement unit 32 measures the quiescent power supply current at the strobe point 1 to obtain the measured value $I_{Q1}$. This measured value $I_{Q1}$ is stored in the table memory 41 and supplied to the good or defective judgement unit 43.

At step S42, the good or defective judgement unit 43 calculates a ratio $R_{Q1}$ corresponding to the prediction of the average value Iq of the measured values $I_{Qj}$. The ratio $R_{Q1}$ is $I_{Q1}/R_1$. Next, it sets the value of the variable Z to 2, that is, Z =2.

At step S43, the good or defective judgement unit 43 calculates the allowable error E. The allowable error E is the larger of the absolute value of the estimated error rate $E_R \times R_{Q1}$ and the absolute value of the maximum measurement error $E_M$.

At step S44, the signal drive unit 31 applies a test signal of a predetermined test pattern to the CMOS integrated circuit 50, and the measurement unit 32 measures the quiescent power supply current $I_{Qj}$ at a strobe point Z(Z>1). The measured value $I_{Qj}$ is stored in the table memory 41 and is supplied to the good or defective judgement unit 43.

At step S45, the good or defective judgement unit 43 calculates a defect current prediction $P_{Q1j}$. The defect current prediction $P_{Q1j}$ is $I_{Qj} - R_j \times R_{Q1}$.

At step S46, the good or defective judgement unit 43 compares the defect current prediction $P_{Q1j}$ with the allowable error E.

When $P_{Q1j}$ is above E, the routine proceeds to step S47, where the good or defective judgement unit 43 detects the fact that there is a defect current at the strobe point Z and judges the CMOS integrated circuit 50 under test as a defect, the output unit 44 outputs the judgement results etc., and the test is ended. Note that it is also possible to judge the existence of a defect current for all the strobe points.

When $P_{Q1j}$ is not above E, the routine proceeds to step S48.

At step S48, the good or defective judgement unit 43 compares the defect current prediction $P_{Q1j}$ with −E.

When $P_{Q1j}$ is below −E, the routine proceeds to step S49, where the good or defective judgement unit 43 detects that there is a defect current at a strobe point other than the strobe point Z and judges the CMOS integrated circuit 50 as a defect, the output unit 44 outputs the judgement results etc., and the test ends. Note that it is also possible to judge the existence of a defect current for all the strobe points.

When $P_{Q1j}$ is not below −E, the routine proceeds to step 50.

At step 50, the control unit 21 judges whether or not measurement of the quiescent power supply current has been finished for all the predetermined strobe points (Z =1 to m).

When the predetermined measurement is not finished, the routine proceeds to step S51, where the value of Z is incremented to increase it by exactly "1", then the test returns to step S44 where the next measurement is performed.

When the predetermined measurement is finished, the routine proceeds to step S52, where the output unit 44 displays or prints out the judgement results of the good or defective of the CMOS integrated circuit, the measurement results, various calculation results, etc. It is also possible to have the good or defective judgement unit 43 judge the CMOS integrated circuit 50 under test as good and have the output unit 44 output that judgement result when for example $-E \leq P_{Q1j} \leq E$.

FIG. 12 is a schematic flow chart illustrating the test method which the test device 100 in relation to the upper and lower limit method in the one point method.

The test device 100 is made one for which the reference average value ratios $R_j^{REF}$ have been calculated in advance for a predetermined number of samples of CMOS integrated circuits and one for which the proportional coefficient $\sigma_R$ shown in the above formula (10-3) has been calculated in advance. Further, the reference average value ratios $R_j^{REF}$ are used as the average value ratios $R_j$ during the test.

First, at step S61, the signal drive unit 31 applies a test signal of a predetermined test pattern to the CMOS integrated circuit 50, and the measurement unit 32 measures the quiescent power supply current at the strobe point 1 to obtain the measured value $I_{Q1}$. This measured value $I_{Q1}$ is stored in the table memory 41 and supplied to the good or defective judgement unit 43.

At step S62, the good or defective judgement unit 43 calculates a ratio $R_{Q1}$ corresponding to the prediction of the average value Iq of the measured values $I_{Qj}$. The ratio $R_{Q1}$ is $I_{Q1}/R_1$. Next, it sets the value of the variable Z to 2, that is, Z=2.

At step S63, the signal drive unit 31 applies a test signal of a predetermined test pattern to the CMOS integrated circuit 50, and the measurement unit 32 measures the quiescent power supply current $I_{Qj}$ at a strobe point Z(Z>1) to obtain a measured value $I_{Qj}$. The measured value $I_{Qj}$ is stored in the table memory 41 and is supplied to the good or defective judgement unit 43.

At step S64, the good or defective judgement unit 43 calculates an upper limit threshold $I_{QU}$ and a lower limit threshold $I_{QL}$. The upper limit threshold $I_{QU}$ is $(1+6\sigma_R) \times R_{Q1}$ and the lower limit threshold $I_{QL}$ is $(1-6\sigma_R) \times R_{Q1}$.

At step S65, the good or defective judgement unit 43 compares the measured value $I_{Qj}$ with the upper limit and lower limit thresholds $I_{QU}$ and $I_{QL}$.

When $I_{Qj} > I_{QU}$ or $I_{Qj} < I_{QL}$ stands, the routine proceeds to step S66, where the good or defective judgement unit 43 detects that there is a defect current at the strobe point Z and judges the CMOS integrated circuit 50 under test as a defect, the output unit 44 outputs the judgement results etc., and the test ends. Note that it is also possible to judge the existence of a defect current for all the strobe points.

When $I_{Qj} > I_{QU}$ and $I_{Qj} < I_{QL}$ do not stand, that is, when $I_{QL} \leq I_{Qj} \leq I_{QU}$, the routine proceed to step S67.

At step 67, the control unit 21 judges whether or not measurement of the quiescent power supply current has been finished for all the predetermined strobe points (Z =1 to m).

When the predetermined measurement is not finished, the test proceeds to step S68, where the value of the variable Z is incremented to increase it by exactly "1", then the test returns to step S63 where the next measurement is performed.

When the predetermined measurement is finished, the routine proceeds to step S69, where the output unit 44 displays or prints out the judgement results of the good or defective of the CMOS integrated circuit, the measurement results, various calculation results, etc. It is also possible to have the good or defective judgement unit 43 judge the CMOS integrated circuit 50 under test as good and have the output unit 44 output that judgement result when for example $I_{QL} \leq I_{Qj} \leq I_{QU}$.

As explained above, in the method of testing a CMOS integrated circuit according to the present invention, there is no need to add any special element or structure to the CMOS integrated circuit 50 and therefore a rise in the manufacturing cost of the CMOS integrated circuit 50 due to testing can be suppressed.

Further, it is possible to use a general-purpose logic tester for the testing. In this regard as well, it is possible to suppress a rise in the manufacturing cost of the CMOS integrated circuit 50.

Moreover, it is possible to test in an actual operating mode or under conditions after shipment, to prevent occurrence of circuit failures due to testing, to prevent defects being missed, and to improve the quality (good or defective evaluation) and reliability of shipments of CMOS integrated circuits 50.

Furthermore, the good or defective and reliability of shipments of the integrated circuits can be improved by performing the method of testing according to the present invention on CMOS integrated circuit which would not be $I_{DDQ}$ tested otherwise in view of the cost of employing methods to reduce the leakage current.

Further, when lowering the good or defective judgement threshold of the quiescent power supply current $I_Q$ to judge good or defective, the test method according to the present invention can be used to reduce the frequency by which good devices are judged as defects.

Moreover, by applying the test method according to the present invention to $I_{DDQ}$ testing in which the effective gate length is less than about 0.25 μm, for example, about 0.25 to 0.1 μm or about 0.25 to 0.05 μm, it is possible to improve the good or defective of the CMOS integrated circuit.

Further, by applying the test method to a CMOS integrated circuit in which the quiescent power supply current $I_Q$ is large due to a high temperature test and $I_{DDQ}$ testing is not possible, for example, a CMOS integrated circuit having an effective gate length of 0.5 μm or more, it is possible to improve the good or defective.

Moreover, by using the test method along with other methods of reducing the FET leakage current, the good or defective can be even further improved.

Moreover, by applying the test method of the present invention to a standby test performing the $I_{DDQ}$ testing on a single measurement point (standby current test) or a multiple point $I_{DDQ}$ test performing the $I_{DDQ}$ testing on several measurement points so as to perform the $I_{DDQ}$ testing on even more points, the quality (good or defective) judgment can be even further improved.

Note that the present invention is not limited to the above embodiments and includes modifications within the scope of the claims.

That is, in the method of testing a CMOS integrated circuit according to the present invention, since use is made of average value ratios of quiescent power supply currents at a plurality of strobe points calculated in advance for a good CMOS integrated circuit and an average value of measured values of the quiescent power supply currents, it is possible to determine the distribution of quiescent power supply currents in a good CMOS integrated circuit with reference to the average value of the quiescent power supply currents and therefore learn the ranges which measured values can take when the CMOS integrated circuit under test is a good one from the average value ratios of the quiescent power supply currents and the average value of the measured values.

For example, the method calculates defect current estimates $P_{Dj} = I_{Qj} - R_j \times Iq$ based on the average value ratios $R_j$ of quiescent power supply currents at the plurality of strobe points, the measured values $I_{Qj}$, and the average value Iq of the measured values.

By multiplying the average value Iq of the measured values by an average value ratio $R_j$, it is possible to calculate the expected value of a quiescent power supply current $I_{DDQ}$ in a case where the CMOS integrated circuit under test is a good one. By subtracting this expected value ($R_j \times Iq$) from a measured value $I_{Qj}$, it is possible to obtain a defect current estimate.

Note that a defect current estimate $P_{Dj}$ can be predicted from a defect current $I_{Dj}$ at that strobe point, the summation of the defect currents at all strobe points, the total number m of the strobe points, and the average value ratio $R_j$, so a value not depending on the size of a measured value of the quiescent power supply current can be obtained.

Further, the method for example calculates defect current predictions $P_{Q1j} = I_{Qj} - R_j \times I_{Q1}/R_1$ based on the average value ratios $R_j$ of the quiescent power supply currents at a plurality of strobe points, the measured values $I_{Qj}$, and the ratio ($I_{Q1}/R_1$).

By multiplying the ratio ($I_{Q1}/R_1$) corresponding to the prediction of the average value of the measured values and an average value ratio $R_j$, it is possible to calculate an expected value of the quiescent power supply current $I_{DDQ}$ in a case where the CMOS integrated circuit under test is a good device. By subtracting this expected value ($I_{Q1} \times R_j/R_1$) from a measured value $I_{Qj}$, it is possible to obtain a defect current prediction.

Note that, as explained above, the defect current prediction $P_{Q1j}$ can be projected from the defect currents $I_{Dj}$ and $I_{D1}$ at strobe points and the average value ratios $R_j$ and $R_1$, so a value not depending on the size of the measured value of the quiescent power supply current can therefore be obtained.

The method for example calculates an upper limit threshold $I_{QU} = (1 + f \times \sigma_R) \times I_{Q1}/R_1$ based on the average value ratio $R_1$ of the quiescent power supply current at the predetermined strobe point, the ratio ($I_{Q1}/R_1$), and a constant f of 4 to 7.

By multiplying the ratio ($I_{Q1}/R_1$) corresponding to the prediction of average value of the measured values by ($f \times \sigma_R$) relating to the standard deviation of the average value ratios $R_1$, it is possible to calculate the range of distribution of the quiescent power supply current $I_{DDQ}$ in the case where the CMOS integrated circuit under test is good. By adding this range ($f \times \sigma_R \times I_{Q1}/R_1$) and the ratio ($I_{Q1}/R_1$), it is possible to obtain the upper limit threshold.

$\sigma_R$ can be calculated from an average value ratio $R_1$ and the total number m of the strobe points, so a value not depending on the measured value of the quiescent power supply current can be obtained.

The method for example calculates the lower limit threshold $I_{QL} = (1 - f \times \sigma_R) \times I_{Q1}/R_1$ based on the average value ratio $R_1$ of the quiescent power supply current at the predetermined strobe point, the ratio ($I_{Q1}/R_1$), and a constant f of 4 to 7.

By multiplying the ratio ($I_{Q1}/R_1$) corresponding to the prediction of the average value of the measured values by ($f \times \sigma_R$) relating to the standard deviation of the average value ratios $R_1$, it is possible to calculate the range of distribution of the quiescent power supply current $I_{DDQ}$ the case where the CMOS integrated circuit under test is good. By subtracting this range ($f \times \sigma_R \times I_{Q1}/R_1$) from the ratio ($I_{Q1}/R_1$), it is possible to obtain the lower limit threshold.

$\sigma_R$ can be calculated from the average value ratio $R_1$ and the total number m of the strobe points, so a value not depending on the measured value of the quiescent power supply current can be obtained.

The method of analyzing a CMOS integrated circuit according to the present invention calculates defect current estimates $P_{Dj}=I_{Qj}-R_j \times Iq$ based on the average value ratios $R_j$ of quiescent power supply currents at a plurality of strobe points, measured values $I_{Qj}$, and an average value Iq.

By multiplying the average value Iq of the measured values by an average value ratio $R_j$, it is possible to calculate the expected value of a quiescent power supply current $I_{DDQ}$ in the case where the CMOS integrated circuit under test is good. By subtracting this expected value ($R_j \times Iq$) from a measured value $I_{Qj}$, it is possible to obtain a defect current estimate.

By calculating the absolute value $|R_{DSUM}/R_{SUM}|$ of a ratio between the summation $P_{DSUM}$ of the negative value defect current estimated values $P_{Dj}$ and the summation $R_{SUM}$ of the average value ratios $R_J$ for the strobe points corresponding to the negative value defect current estimated values $P_{DJ}$, it is possible to obtain a variation $\Delta Iq$ showing the difference between the average value of the measured values and the average value of FET leakage currents.

As explained above, according to the methods apparatus of testing and analyzing a CMOS integrated circuit of the present invention, it is possible to detect and analyze defect currents even with a CMOS integrated circuit with a large quiescent power supply current and large variations.

What is claimed is:

1. A method of testing a CMOS integrated circuit comprising the steps of:

applying a test signal to a CMOS integrated circuit under test and measuring a quiescent power supply current at part or all of the strobe points among a predetermined plurality of strobe points; and judging the good or defective of the CMOS integrated circuit under test based on average value ratios of quiescent power supply currents of said plurality of strobe points calculated in advance for a good CMOS integrated circuit, the measured values at the part or all of the strobe points, and the average value of the measured values.

2. A method of testing a CMOS integrated circuit as set forth in claim 1, wherein the step of judging the good or defective of the CMOS integrated circuit based on the average value ratios, the measured values, and the average value, comprises the steps of:

calculating defect current estimated values $P_{DJ}$: $I_{Qj}-R_j \times Iq$ corresponding to the strobe points based on the average value ratios $R_j$ of the quiescent power supply currents at the plurality of strobe points, the measured values $I_{Qj}$ at the part or all of the strobe points, and the average value Iq; and judging the good or defective of the CMOS integrated circuit under test based on the calculated defect current estimated values $P_{Dj}$ and allowable error E of the measured values of the quiescent power supply current.

3. A method of testing a CMOS integrated circuit as set forth in claim 2, wherein the step of judging good or defective of the CMOS integrated circuit based on the defect current estimated value $P_{Dj}$ and the allowable error E judges the CMOS integrated circuit under test as a defect when an absolute value of a calculated defect current estimated value $P_{DJ}$ is larger than an absolute value of the allowable error E.

4. A method of testing a CMOS integrated circuit as set forth in claim 2, wherein the step of judging good or defective of the CMOS integrated circuit based on the defect current estimated value $P_{Dj}$ and the allowable error E, comprises the steps of:

calculating a variation rate $P_{STQ}=Iq \times (R_b-R_s)/(I_{Qb}-I_{Qs})$ when each of a plurality of absolute values of the plurality of defect current estimated value $P_{Dj}$ corresponding to all of the strobe points is not more than the absolute value of the allowable error E; and judging the CMOS integrated circuit under test as a defect when the variation rate $P_{STQ}$ is greater than 1, where $R_b$ is the biggest average value ratio among the average value ratios $R_j$, $I_{Qb}$ is the measured value of the strobe point corresponding to the biggest average value ratio $R_b$, $R_s$ is the smallest average value ratio among the average value ratios $R_j$, and $I_{Qs}$ is the measured value of the strobe point corresponding to the smallest average value ratio $R_s$.

5. A method of testing a CMOS integrated circuit as set forth in claim 4, wherein the step of judging good or defective of the CMOS integrated circuit based on the defect current estimated value $P_{Dj}$ and the allowable error E further comprises a step of judging the CMOS integrated circuit under test as good when the variation rate $P_{STQ}$ is less than 1.

6. A method of testing a CMOS integrated circuit as set forth in claim 2, wherein the allowable error E of the measured quiescent power supply current is whichever of a product ($E_R \times Iq$) of a maximum error rate $E_R$ among error rates $E_{Rj}$ of average value ratios $R_j$ at the plurality of strobe points and the average value Iq and of a maximum measurement error $E_M$ has a larger absolute value.

7. A method of testing a CMOS integrated circuit as set forth in claim 1, wherein the average value is defined as an arithmetic average value of the measured values at part or all of the strobe points.

8. A method of testing a CMOS integrated circuit as set forth in claim 1, wherein the average value is defined as a ratio ($I_{Q1}/R_1$) between a measured quiescent power supply current $I_{Q1}$ at a predetermined strobe point of the part or all of the strobe points and the average value ratio $R_1$ of the quiescent power supply current at the predetermined strobe point.

9. A method of testing a CMOS integrated circuit as set forth in claim 8, wherein the step of judging good or defective of the CMOS integrated circuit based on the average value ratios, the measured values, and the average value comprises the steps of:

calculating defect current predictions $P_{Q1j}=I_{Qj}-R_j \times (I_{Q1}/R_1)$ corresponding to the strobe points based on the average value ratios $R_j$ of the quiescent power supply currents at the plurality of strobe points, the measured values $I_{Qj}$ at the part or all of the strobe points, and the ratio($I_{Q1}/R_1$); and judging good or defective of the CMOS integrated circuit based on the calculated defect current predictions $P_{Q1j}$ and the allowable error E of the, measured values of the quiescent power supply current.

10. A method of testing a CMOS integrated circuit as set forth in claim 9, wherein the step of judging good or defective of the CMOS integrated circuit based on the defect current predictions $P_{Q1j}$ and the allowable error E comprises a step of judging the CMOS integrated circuit under test as a defect when an absolute value of a calculated defect current prediction $P_{Q1j}$ is larger than an absolute value of the allowable error E.

11. A method of testing a CMOS integrated circuit as set forth in claim 9, wherein the allowable error E of the measured quiescent power supply current is whichever of a product $(E_R \times I_{Q1}/R_1)$ of a maximum error ratio $E_R$ among a plurality of error ratios $E_{Rj}$ of the average value ratios $R_j$ of the quiescent power supply current at the plurality of strobe points and the ratio $(I_{Q1}/R_1)$ and of the maximum measurement error $E_M$ has the larger absolute value.

12. A method of testing a CMOS integrated circuit as set forth in claim 8, wherein the step of judging good or defective of the CMOS integrated circuit based on the average value ratios, the measured values, and the average value, comprises the steps of:
    calculating an upper limit threshold $I_{QU} = (1 + f \times \sigma_R) \times I_{Q1}/R_1$ based on the average value ratio $R_1$ of the quiescent power supply current at the predetermined strobe point, the ratio $(I_{Q1}/R_1)$, and a constant f of 4 to 7; and
    judging the CMOS integrated circuit under test as a defect when a measured quiescent power supply current is larger than the upper limit threshold $I_{QU}$,
    where $\sigma_R$ is the square root of the average value of $(R_j - 1)^2$ at the plurality of strobe points.

13. A method of testing a CMOS integrated circuit as set forth in claim 12, wherein the step of judging good or defective of the CMOS integrated circuit based on the average value ratios, the measured values, and the average value, further comprises the steps of:
    calculating a lower limit threshold $I_{QL} = (1 - f \times \sigma_R) \times I_{Q1}/R_1$;
    judging the CMOS integrated circuit under test as a defect when a measured value is below the lower limit threshold $I_{QL}$; and
    judging the CMOS integrated circuit under test as good when each of the measured values at the part or all of the strobe points between the lower limit threshold $I_{QL}$ and the upper limit threshold $I_{QU}$.

14. A method of testing a CMOS integrated circuit as set forth in claim 12, wherein the value of the constant f is 5 to 6.

15. A method of testing a CMOS integrated circuit as set forth in claim 8, wherein the step of judging good or defective of the CMOS integrated circuit based on the average value ratios, the measured values, and the average value, comprises the steps of:
    calculating a lower limit threshold $I_{QL} = (1 - f \times \sigma_R) \times I_{Q1}/R_1$ based on the average value ratio $R_1$ of the quiescent power supply current at the predetermined strobe point, the ratio $(I_{Q1}/R_1)$, and a constant f of 4 to 7; and
    judging the CMOS integrated circuit under test as a defect when the measured quiescent power supply current is smaller than the lower limit threshold $I_{QL}$,
    where $\sigma_R$ is the square root of the average value of $(R_j - 1)^2$ at the plurality of strobe points.

16. A method of testing a CMOS integrated circuit as set forth in claim 15, wherein the value of the constant f is 5 to 6.

17. A method of testing a CMOS integrated circuit as set forth in claim 8, wherein the predetermined strobe point comprises a first strobe point of the part or all of the strobe points.

18. A method of testing a CMOS integrated circuit as set forth in claim 1, wherein the average value ratios of the quiescent power supply currents at the plurality of strobe points comprises ratios between said plurality of measured values obtained by applying the test signal to a good CMOS integrated circuit and measuring the quiescent power supply current at a plurality of strobe points and the average value of the plurality of measured values which are then in turn averaged for a plurality of good CMOS integrated circuits or for more than a plurality of good CMOS integrated circuits.

19. A method of testing a CMOS integrated circuit as set forth in claim 1, wherein:
    the test signal has a plurality of test patterns, and
    the method further comprises a step of switching test patterns between adjacent strobe points of the plurality of strobe points.

20. A method of analyzing a CMOS integrated circuit, comprising the steps of:
    applying a test signal to a CMOS integrated circuit under test and measuring a quiescent power supply current at a predetermined plurality of strobe points;
    calculating defect current estimated values $P_{Dj} = I_{Qj} - R_j \times Iq$ corresponding to the strobe points based on average value ratios $R_j$ of quiescent power supply currents at the plurality of strobe points calculated in advance for a good CMOS integrated circuit, measured values $I_{Qj}$ at the plurality of strobe points, and an average value Iq of the measured values;
    calculating a summation $P_{DSUM}$ of negative value defect current estimated value $P_{Dj}$ among the calculated defect current estimated value $P_{Dj}$;
    calculating a summation $R_{SUM}$ of the average value ratios $R_j$ for the strobe points corresponding to the negative value defect current estimated value $P_{Dj}$ among the plurality of strobe points; and
    calculating an absolute value $|P_{DSUM}/P_{SUM}|$ of a ratio of the summation $P_{DSUM}$ of the defect current estimated value $P_{Dj}$ and the summation $R_{SUM}$ of the average value ratios $R_j$.

21. A method of analyzing a CMOS integrated circuit as set forth in claim 20, further comprising the steps of:
    calculating first current values $I_{Dj} = P_{Dj} + R_j + R_j \times |P_{DSUM}/R_{SUM}|$ for strobe points corresponding to a positive value defect current estimated value $P_{Dj}$ among the plurality of strobe points and
    detecting first current values which are larger than an absolute value of an allowable error E of a measured value of the quiescent power supply current among the calculated first current values $I_{Dj}$ as defect current values.

22. A method of analyzing a CMOS integrated circuit as set forth in claim 21, further comprising the steps of:
    calculating a second current value $I_D = (1 - 1/P_{STQ}) \times Iq$ based on a variation rate $P_{STQ} = Iq \times (R_b - R_s)/(I_{Qb} - I_{Qs})$ when each of the calculated first current values $I_{Dj}$ is not more than the absolute value of the allowable error E; and
    detecting that each of the measured values at the plurality of strobe points includes a defect current value indicated by the second current value $I_D$ when the second current value $I_D$ is larger than the absolute value of the allowable error E,
    where $R_b$ is the biggest average value ratio among the average value ratios $R_j$,
    $I_{Qb}$ is the measured value at the strobe point corresponding to the biggest average value ratio $R_b$, $R_s$ is the smallest average value ratio among the average value ratios $R_j$, and $I_{Qs}$ is the measured value at the strobe point corresponding to the smallest average value ratio $R_s$.

23. A method of analyzing a CMOS integrated circuit as set forth in claim 22, further comprising a step of detecting that each of the measured values at the plurality of strobe points does not include a defect current value when the second current value $I_D$ is not more than the absolute value of the allowable error E.

24. A method of analyzing a CMOS integrated circuit as set forth in claim 21, wherein the allowable error E of the measured quiescent power supply current is whichever of a product ($E_R \times Iq$) of a maximum error rate $E_R$ among error rates $E_{RJ}$ of average value ratios $R_j$ of the quiescent power supply current at the plurality of strobe points and the average value Iq and of a maximum measurement error $E_M$ has a larger absolute value.

25. A method of analyzing a CMOS integrated circuit as set forth in claim 20, wherein the average value is defined as an arithmetic average value of the measured values at the plurality of strobe points.

26. A method of analyzing a CMOS integrated circuit as set forth in claim 20, wherein the average value ratios of the quiescent power supply currents at the plurality of strobe points comprise ratios between said plurality of measured values obtained by applying the test signal to a good CMOS integrated circuit and measuring the quiescent power supply current at a plurality of strobe points and the average value of the plurality of measured values which are then in turn averaged for a plurality of good CMOS integrated circuits or for more than a plurality of good CMOS integrated circuits.

27. A method of analyzing a CMOS integrated circuit as set forth in claim 20, wherein:

the test signal has a plurality of test patterns, and the method further comprises a step of switching test patterns between adjacent strobe points of the plurality of strobe points.

28. An apparatus for testing a CMOS integrated circuit comprising;

a means for applying a test signal to a CMOS integrated circuit under test and measuring a quiescent power supply current at part or all of the strobe points among a predetermined plurality of strobe points; and a means for judging the good or defective of the CMOS integrated circuit under test based on average value ratios of quiescent power supply currents of said plurality of strobe points calculated in advance for a good CMOS integrated circuit, the measured values at the part or all of the strobe points, and the average value of the measured values.

29. An apparatus for analyzing a CMOS integrated circuit, comprising:

a means for applying a test signal to a CMOS integrated circuit under test and measuring a quiescent power supply current at a predetermined plurality of strobe points;

a means for calculating defect current estimated values $P_{Dj} = I_{Qj} - R_j \times Iq$ corresponding to the strobe points based on average value ratios $R_j$ of quiescent power supply currents at the plurality of strobe points calculated in advance for a good CMOS integrated circuit, measured values $I_{Qj}$ at the plurality of strobe points, and an average value Iq of the measured values;

a means for calculating a summation $P_{DSUM}$ of negative value defect current estimated value $P_{Dj}$ among the calculated defect current estimated value $P_{Dj}$;

a means for calculating a summation $R_{SUM}$ of the average value ratios $R_j$ for the strobe points corresponding to the negative value defect current estimated value $P_{Dj}$ among the plurality of strobe points; and a means for calculating an absolute value $|P_{DSUM}/P_{SUM}|$ of a ratio of the summation $P_{DSUM}$ of the defect current estimated value $P_{Dj}$ and the summation $R_{SUM}$ of the average value ratios $R_j$.

* * * * *

UNITED STATES PATENT AND TRADEMARK OFFICE
CERTIFICATE OF CORRECTION

PATENT NO. : 6,515,500 B1
DATED : February 4, 2003
INVENTOR(S) : Yukio Okuda

It is certified that error appears in the above-identified patent and that said Letters Patent is hereby corrected as shown below:

Column 27,
Line 58, "$P_{DJ}$" should read -- $P_{Dj}$ --.

Column 28,
Line 7, "$P_{DJ}$" should read -- $P_{Dj}$ --.

Column 30,
Line 36 "value $|P_{DSUM}/P_{SUM}|$ of" should read -- value $|P_{DSUM}/P_{SUM}|$ of --

Column 31,
Line 15, "$E_{RJ}$" should read -- $E_{Rj}$ --.

Signed and Sealed this

Twenty-sixth Day of August, 2003

JAMES E. ROGAN
*Director of the United States Patent and Trademark Office*